United States Patent
Ogasawara et al.

(10) Patent No.: US 10,224,172 B2
(45) Date of Patent: Mar. 5, 2019

(54) MULTI-BEAM OPTICAL SYSTEM ADJUSTMENT METHOD, AND MULTI-BEAM EXPOSURE APPARATUS

(71) Applicant: NuFlare Technology, Inc., Yokohama-shi (JP)

(72) Inventors: Munehiro Ogasawara, Hiratsuka (JP); Hirofumi Morita, Setagaya-ku (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/797,588

(22) Filed: Oct. 30, 2017

(65) Prior Publication Data

US 2018/0130632 A1    May 10, 2018

(30) Foreign Application Priority Data

Nov. 9, 2016  (JP) ................ 2016-218841

(51) Int. Cl.
| | |
|---|---|
| *H01J 37/09* | (2006.01) |
| *H01J 37/20* | (2006.01) |
| *H01J 37/244* | (2006.01) |
| *H01J 37/317* | (2006.01) |

(52) U.S. Cl.
CPC .............. *H01J 37/09* (2013.01); *H01J 37/20* (2013.01); *H01J 37/244* (2013.01); *H01J 37/3174* (2013.01)

(58) Field of Classification Search
CPC ...... H01J 37/3177; H01J 37/244; H01J 37/09; H01J 37/3045; H01J 37/226; H01J 37/3005; H01J 2237/0435; H01J 2237/31774; H01J 2237/30455; H01J 2237/153; H01J 2237/20292; H01J 2237/24535; H01J 2237/34564; H01J 2237/30433; H01J 2237/31798
USPC ............... 250/396 R, 397, 398, 492.2, 492.3
See application file for complete search history.

(56) References Cited

U.S. PATENT DOCUMENTS

| | | | | |
|---|---|---|---|---|
| 8,835,868 B2 * | 9/2014 | Touya | .................... | B82Y 40/00 250/396 R |
| 9,099,277 B2 * | 8/2015 | Platzgummer | ........ | H01J 37/045 |
| 9,466,461 B2 * | 10/2016 | Iizuka | ................ | H01J 37/3045 |
| 9,734,984 B2 * | 8/2017 | Iwata | .................... | H01J 37/243 |
| 9,737,272 B2 * | 8/2017 | Lee | ....................... | A61N 5/1077 |

(Continued)

FOREIGN PATENT DOCUMENTS

JP    2015-23286    2/2015

*Primary Examiner* — David A Vanore
(74) *Attorney, Agent, or Firm* — Oblon, McClelland, Maier & Neustadt, L.L.P.

(57) ABSTRACT

A multi-beam optical system adjustment method includes forming multi-beams by making a region including the whole of a plurality of openings in a shaping aperture array substrate irradiated by a charged particle beam, and making portions of the charged particle beam individually pass through a corresponding one of the plurality of openings, measuring a distortion of the multi-beams while variably changing the crossover height position of the multi-beams, measuring the crossover height position of the multi-beams where the distortion of the multi-beams is smaller than the others, and adjusting the height position of a limiting aperture substrate which limits passage of a beam deviated from the trajectory in the multi-beams to the crossover height position.

9 Claims, 19 Drawing Sheets

(56) References Cited

U.S. PATENT DOCUMENTS

| | | | | |
|---|---|---|---|---|
| 9,852,876 B2* | 12/2017 | Kato | ................... | H01J 37/147 |
| 9,899,187 B2* | 2/2018 | Kato | ................... | H01J 37/3026 |
| 9,916,962 B2* | 3/2018 | Nishimura | ............ | H01J 37/045 |
| 9,947,509 B2* | 4/2018 | Matsumoto | ......... | H01J 37/3174 |
| 9,966,228 B2* | 5/2018 | Iizuka | ................ | H01J 37/3177 |
| 2014/0175302 A1* | 6/2014 | Touya | ................... | B82Y 40/00 |
| | | | | 250/398 |
| 2015/0021493 A1 | 1/2015 | Platzgummer | | |
| 2017/0178862 A1* | 6/2017 | Ogasawara | ............ | H01J 37/045 |
| 2017/0309440 A1* | 10/2017 | Nishimura | ............ | H01J 37/045 |
| 2018/0005799 A1* | 1/2018 | Hasegawa | ............ | H01J 37/3177 |
| 2018/0130632 A1* | 5/2018 | Ogasawara | ............. | H01J 37/09 |
| 2018/0138013 A1* | 5/2018 | Iizuka | ................... | H01J 37/045 |

\* cited by examiner

MULTI-BEAM OPTICAL SYSTEM ADJUSTMENT METHOD, AND MULTI-BEAM EXPOSURE APPARATUS

CROSS-REFERENCE TO RELATED APPLICATION

This application is based upon and claims the benefit of priority from the prior Japanese Patent Application No. 2016-218841 filed on Nov. 9, 2016 in Japan, the entire contents of which are incorporated herein by reference.

BACKGROUND OF THE INVENTION

Field of the Invention

Embodiments of the present invention relate to a multi-beam optical system adjustment method, and a multi-beam exposure apparatus, and for example, to an adjustment method for electron beam optical system in multi-beam writing using electron beams.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits becomes progressively narrower year by year. The electron beam writing technique which intrinsically has excellent resolution is used for writing or "drawing" a pattern on a wafer, etc. with electron beams.

As a known example of employing the electron beam writing technique, there is a writing apparatus using multi-beams. Since it is possible for multi-beam writing to irradiate multiple beams at a time, the writing throughput can be greatly increased in comparison with single beam writing. For example, a writing apparatus employing the multi-beam technique forms multi-beams by letting portions of an electron beam emitted from an electron gun pass through a corresponding hole of a plurality of holes in a mask, performs blanking control for each beam, and focuses (forms) an image of each beam not having been blocked on a target object or "sample" by an objective lens (e.g., refer to Japanese Patent Application Laid-open (JP-A) No. 2015-023286).

In an exposure apparatus using electron beams, such as a multi-beam writing apparatus, electron beams to be used for irradiation are transmitted to a target object after once being converged by an optical system and forming a crossover. A limiting aperture which limits passage of extra electrons is placed at the crossover position. When actually focusing (forming) an electron beam on the target object surface by an objective lens, an actual crossover position may deviate from the design position due to lens manufacturing errors, or the like. In such a case, if the crossover position is adjusted to the design position by the lens on the upstream side, distortion of the image focused (formed) on the target object surface becomes large. In particular, in multi-beam writing, since the size of the image formed on the target object surface is markedly large compared to single beam writing, if distortion becomes large, the multi-beam writing will be greatly subject to the influence of the distortion compared to single beam writing. Therefore, it is preferable to make the distortion small.

On the other hand, if the crossover position deviates from the design position, since the beam size on the limiting aperture surface becomes large, it becomes difficult to make sufficient beams pass therethrough. In order to solve this problem, the aperture diameter of the limiting aperture should be widened. Beam loss can be avoided by widening the aperture diameter of the limiting aperture. However, if the aperture diameter of the limiting aperture is widened, extra electrons, the passage of which should originally be limited, also pass therethrough. Due to these extra electrons (leakage beam), a new problem occurs in that the contrast of the image focused (formed) on the target object surface decreases. Furthermore, in the case of performing blanking control by the limiting aperture, a large amount of blanking deflection is needed to have a beam OFF condition, which provides difficulty in performing blanking control.

BRIEF SUMMARY OF THE INVENTION

According to one aspect of the present invention, a multi-beam optical system adjustment method includes forming multi-beams by making a region including a whole of a plurality of openings in a shaping aperture array substrate irradiated by a charged particle beam, and making portions of the charged particle beam individually pass through a corresponding one of the plurality of openings; measuring a distortion of the multi-beams while variably changing a crossover height position of the multi-beams; measuring the crossover height position of the multi-beams where the distortion of the multi-beams is smaller than others; and adjusting a height position of a limiting aperture substrate which limits passage of a beam deviated from a trajectory in the multi-beams to the crossover height position.

According to another aspect of the present invention, a multi-beam exposure apparatus includes an emission source configured to emit a charged particle beam, an illumination lens configured to illuminate a target with the charged particle beam, a shaping aperture array substrate, in which a plurality of openings are formed, configured to form multi-beams by making a region including a whole of the plurality of openings irradiated with the charged particle beam emitted, and making portions of the charged particle beam individually pass through corresponding the plurality of openings, a limiting aperture substrate configured to limit passage of a beam deviated from a trajectory in the multi-beams, a height position adjusting mechanism configured to variably adjust a height position of the limiting aperture substrate, and a distortion measuring mechanism configured to measure a distortion of the multi-beams.

DETAILED DESCRIPTION OF THE INVENTION

Embodiments below describe an optical system adjustment method and an exposure apparatus which can restrict passage of an extra electron while inhibiting distortion of formed images of multi-beams.

In the embodiments below, there will be described a configuration in which an electron beam is used as an example of a charged particle beam. The charged particle beam is not limited to the electron beam, and other charged particle beam such as an ion beam may also be used. Moreover, in the Embodiments, the configuration using a writing apparatus as an example of an exposure apparatus will be described. However, the exposure apparatus is not limited to the writing apparatus, and may be an apparatus, such as an inspection apparatus, which irradiates a target object with charged particle beams.

First Embodiment

Figure 1:
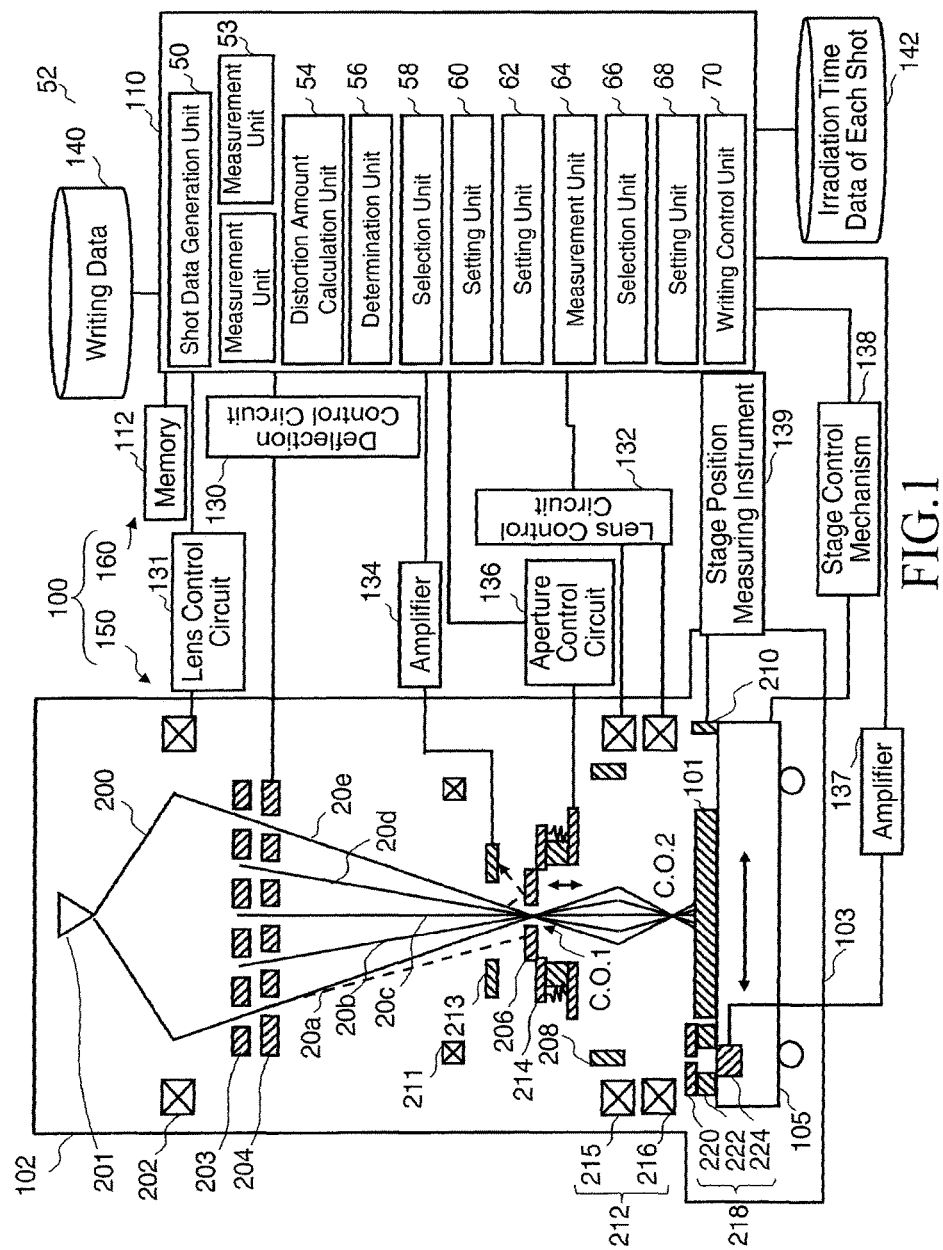
FIG. 1 is a schematic diagram showing a configuration of a writing apparatus according to a first embodiment.

FIG. 1 is a schematic diagram showing a configuration of a writing or "drawing" apparatus according to a first embodiment. As shown in FIG. 1, a writing apparatus 100 includes a writing mechanism 150 and a control system 160. The writing apparatus 100 is an example of a multi charged particle beam writing apparatus and an example of a multi charged particle beam exposure apparatus. The writing mechanism 150 includes an electron optical column 102 and a writing chamber 103. In the electron optical column 102, there are arranged an electron gun 201, an illumination lens 202 (electromagnetic lens), a shaping aperture array substrate 203, a blanking aperture array mechanism 204, a limiting aperture substrate 206, an objective lens group 212, a deflector 208, a detector 213, an alignment coil 211, and a height position adjusting mechanism 214. In the writing chamber 103, there is arranged an XY stage 105. On the XY stage 105, a target object or "sample" 101 such as a mask serving as a writing target substrate is placed when writing (irradiating) is performed. The target object 101 is, for example, an exposure mask used for fabricating semiconductor devices, or a semiconductor substrate (silicon wafer) for fabricating semiconductor devices. Moreover, the target object 101 may be, for example, a mask blank on which resist has been applied and nothing has yet been written. Further, on the XY stage 105, there are placed an individual beam position detecting mechanism 218, and a mirror 210 for measuring the position of the XY stage 105.

The objective lens group 212 includes objective lenses 215 and 216 (electromagnetic lens) being multiple stages. In FIG. 1, objective lenses 215 and 216 of two stages are included, for example.

The individual beam position detecting mechanism 218 includes a passage mark substrate 220, a block 222, and a current detector 224.

The control system 160 includes a control computer 110, a memory 112, a deflection control circuit 130, a lens control circuit 131, a lens control circuit 132, an amplifier 134, an aperture control circuit 136, an amplifier 137, a stage control mechanism 138, a stage position measuring instrument 139, and storage devices 140 and 142 such as magnetic disk drives. The control computer 110, the memory 112, the deflection control circuit 130, the lens control circuits 131 and 132, the amplifier 134, the aperture control circuit 136, the amplifier 137, the stage control mechanism 138, the stage position measuring instrument 139, and the storage devices 140 and 142 are connected with each other through a bus (not shown). Writing data is input from the outside of the writing apparatus 100 to the storage device 140 to be stored therein. The illumination lens 202 is connected to the lens control circuit 131. The objective lenses 215 and 216, configuring multiple stages, are connected to the lens control circuit 132. The alignment coil 211 is connected to the lens control circuit 132, further. The blanking aperture array mechanism 204 is connected to the deflection control circuit 130. Moreover, the deflector 208 is connected to the deflection control circuit 130 through a DAC amplifier unit (not shown). The detector 213 is connected to the amplifier 134. The height position adjusting mechanism 214 is connected to the aperture control circuit 136. The current detector 224 is connected to the amplifier 137. The stage control mechanism 138 controls the drive of the XY stage 105. The stage position measuring instrument 139 irradiates the mirror 210 on the XY stage 105 with a laser beam, and receives a reflected light from the mirror 210. Then, the stage position measuring instrument 139 measures the position of the XY stage 105 by using information of the reflected light.

In the control computer 110, there are arranged a shot data generation unit 50, a measurement unit 52, a measurement unit 53, a distortion amount calculation unit 54, a determination unit 56, a selection unit 58, a setting unit 60, a setting unit 62, a measurement unit 64, a selection unit 66, a setting unit 68, and a writing control unit 70. Each of the " . . . units" such as the shot data generation unit 50, the measurement unit 52, the measurement unit 53, the distortion amount calculation unit 54, the determination unit 56, the selection unit 58, the setting unit 60, the setting unit 62, the measurement unit 64, the selection unit 66, the setting unit 68, and the writing control unit 70 includes a processing circuitry. As the processing circuitry, for example, an electric circuit, computer, processor, circuit board, quantum circuit, or semiconductor device can be used. Each " . . . unit" may use a common processing circuitry (same processing circuitry), or different processing circuitries (separate processing circuitries). Input data necessary for the shot data generation unit 50, the measurement unit 52, the measurement unit 53, the distortion amount calculation unit 54, the determination unit 56, the selection unit 58, the setting unit 60, the setting unit 62, the measurement unit 64, the selection unit 66, the setting unit 68, and the writing control unit 70, and operated (calculated) results are stored in the memory 112 each time.

Writing data defining a plurality of figure patterns is input from the outside of the writing apparatus 100 to be stored in the storage device 140.

FIG. 1 shows configuration elements necessary for describing the first embodiment. It should be understood that other configuration elements generally necessary for the writing apparatus 100 may also be included therein.

Figure 2:
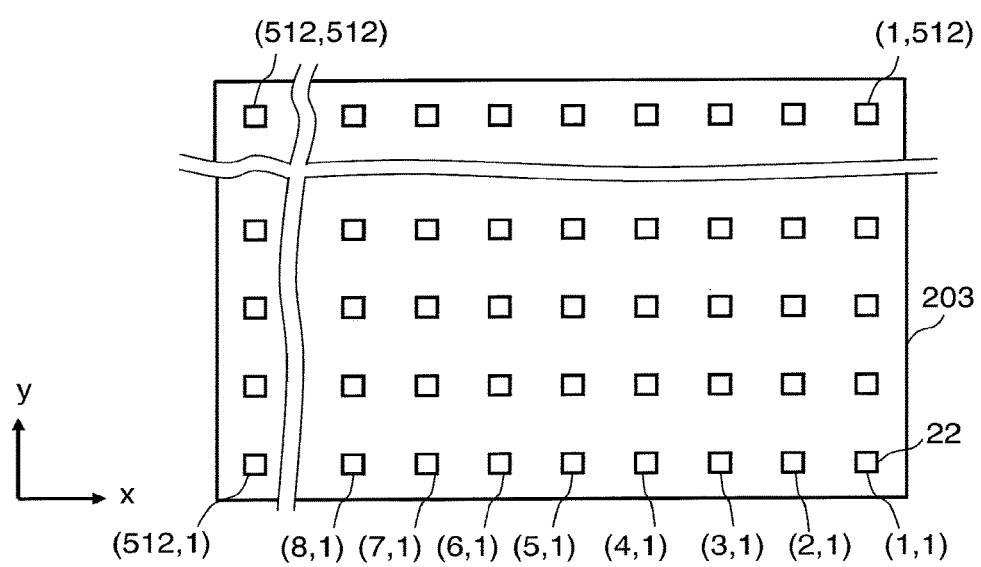
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings, apertures) 22 of p rows long (length in the y direction) and q columns wide (width in the x direction) ($p \geq 2$, $q \geq 2$) are formed, like a matrix, at a predetermined arrangement pitch in the shaping aperture array substrate 203. In FIG. 2, for example, holes 22 of 512 (rows of holes arrayed in the y direction)×512 (columns of holes arrayed in the x direction) are formed. Each of the holes 22 is a quadrangle having the same dimension and shape. Alternatively, each of the holes 22 may be a circle with the same diameter. Multi-beams 20 are formed by letting portions of an electron beam 200 individually pass through a corresponding hole of a plurality of holes 22. Shown here is the case where the holes 22 of two or more rows and columns are arranged horizontally and vertically (in the x and y directions), but the arrangement is not limited thereto. For example, it is also acceptable that a plurality of holes 22 are arranged in only one row (x direction) or in only one column (y direction). That is, in the case of only one row, a plurality of holes 22 are arranged in the x direction as a plurality of columns, and in the case of only one column, a plurality of holes 22 are arranged in the y direction as a plurality of rows. Moreover, the method of arranging the holes 22 is not limited to the case of FIG. 2 where holes are arranged like a grid in the length and width directions. For example, with respect to the kth and the (k+1)th rows arrayed in the length direction (y direction), each hole in the kth row and each hole in the (k+1)th row may be mutually displaced in the width direction (x direction) by a dimension "a". Similarly, with respect to the (k+1)th and the (k+2)th rows arrayed in the length direction (y direction), each hole in the (k+1)th row and each hole in the (k+2)th row may be mutually displaced in the width direction (x direction) by a dimension "b", for example.

Figure 3:
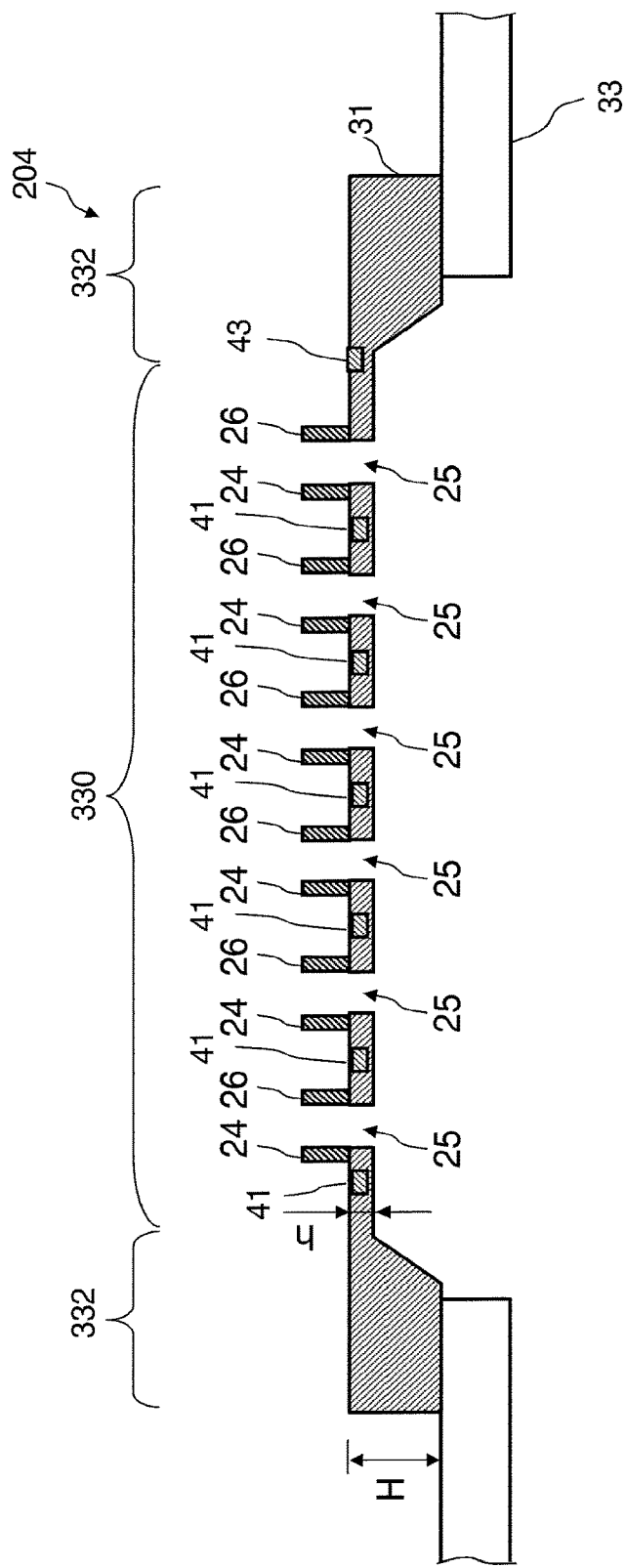
FIG. 3 is a sectional view showing a configuration of a blanking aperture array mechanism according to the first embodiment.

FIG. 3 is a sectional view showing the configuration of a blanking aperture array mechanism according to the first embodiment.

Figure 4:
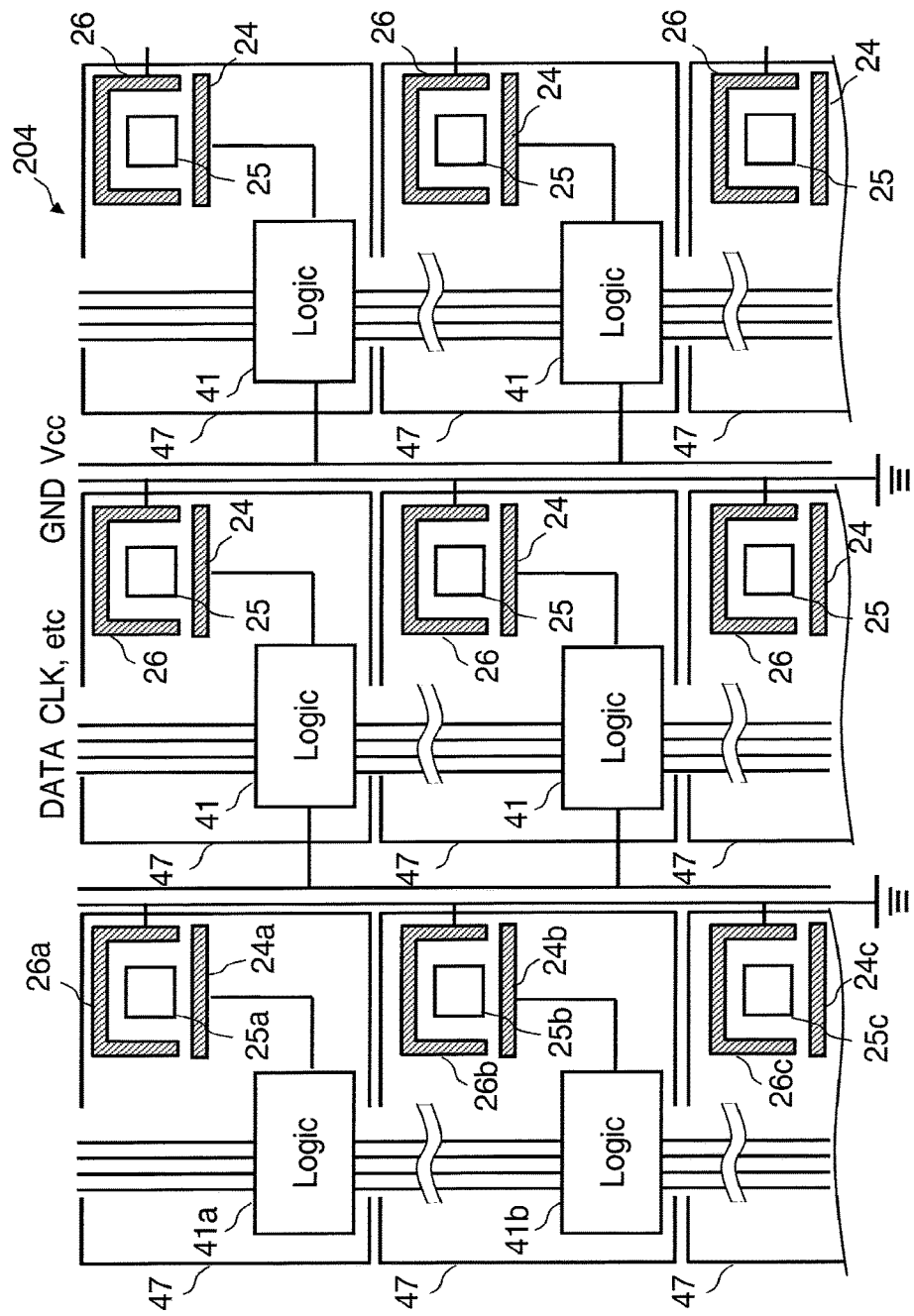
FIG. 4 is a top view conceptual diagram showing a portion of a structure in a membrane region of a blanking aperture array mechanism according to the first embodiment.

FIG. 4 is a top view conceptual diagram showing a portion of the structure in a membrane region of a blanking aperture array mechanism according to the first embodiment. Between FIGS. 3 and 4, the positional relation among a control electrode 24, a counter electrode 26, a control circuit 41, and a pad 43 is not in accordance with each other. With regard to the structure of the blanking aperture array mechanism 204, as shown in FIG. 3, a semiconductor substrate 31 made of silicon, etc. is placed on a support table 33. The central part of the substrate 31 is shaved from the back side, and made into a membrane region 330 (first region) having a thin film thickness h. The circumference surrounding the membrane region 330 is a circumferential region 332 (second region) having a thick film thickness H. The upper surface of the membrane region 330 and the upper surface of the circumferential region 332 are formed to be flush in height with each other, or substantially flush in height with each other. At the back side of the circumferential region 332, the substrate 31 is supported on the support table 33. The central part of the support table 33 is open, and the membrane region 330 is located at this opening region.

In the membrane region 330, passage holes 25 (second openings) through each of which a corresponding one of multi-beams passes are formed at positions each corresponding to each hole 22 of the shaping aperture array substrate 203 shown in FIG. 2. In other words, in the membrane region 330 of the substrate 31, there are formed a plurality of passage holes 25 in an array through each of which a corresponding beam of electron multi-beams passes. Moreover, in the membrane region 330 of the substrate 31, there are arranged a plurality of electrode pairs each composed of two electrodes being opposite each other with respect to a corresponding one of a plurality of passage holes 25. Specifically, in the membrane region 330, as shown in FIGS. 3 and 4, each pair (blanker: blanking deflector) of the control electrode 24 and the counter electrode 26 for blanking deflection is arranged close to a corresponding passage hole 25 in a manner such that the electrodes 24 and 26 are facing each other across the passage hole 25 concerned. Moreover, close to each passage hole 25 in the membrane region 330 of the substrate 31, there is arranged the control circuit 41 (logic circuit) for applying a deflection voltage to the control electrode 24 for the passage hole 25 concerned. The counter electrode 26 for each beam is grounded (earthed).

As shown in FIG. 4, n-bit (e.g., 10-bit) parallel lines for control signals are connected to each control circuit 41. In addition to the n-bit parallel lines for controlling signals, lines for a clock signal, power supply, and the like are connected to each control circuit 41. A part of the parallel lines may be used as the lines for a clock signal, power supply, and the like. An individual blanking mechanism 47 composed of the control electrode 24, the counter electrode 26, and the control circuit 41 is configured for each of the multi-beams. In the example of FIG. 3, the control electrode 24, the counter electrode 26, and the control circuit 41 are arranged in the membrane region 330 having a thin film thickness of the substrate 31. However, it is not limited thereto. A plurality of control circuits 41 formed in an array in the membrane region 330 are grouped per row or per column, and the control circuits 41 in each group are connected in series as shown in FIG. 4. Then, the pad 43 arranged for each group sends a signal to the control circuits 41 in the group concerned. Specifically, a shift register (not shown) is arranged in each control circuit 41, and for example, shift registers in the control circuits for beams in the same row in p×q multiple beams, for example, are connected in series. For example, control signals for beams in the same row in the p×q multiple beams are transmitted in series, and, for example, a control signal for each beam is stored in a corresponding control circuit 41 by p clock signals.

An amplifier (not shown) (an example of a switching circuit) is arranged in the control circuit 41. A CMOS (complementary MOS) inverter circuit is arranged as an example of the amplifier. The CMOS inverter circuit is connected to a positive potential (Vdd: blanking electric potential: first electric potential) (e.g., 5 V) (first electric potential) and to a ground potential (GND: second electric potential). The output line (OUT) of the CMOS inverter circuit is connected to the control electrode 24. On the other hand, the counter electrode 26 is applied with a ground electric potential.

As an input (IN) of the CMOS inverter circuit, either an L (low) electric potential (e.g., ground potential) lower than a threshold voltage, or an H (high) electric potential (e.g., 1.5 V) higher than or equal to the threshold voltage is applied as a control signal. According to the first embodiment, in a state (active state) where an H electric potential is applied to the input (IN) of the CMOS inverter circuit, the output (OUT) of the CMOS inverter circuit becomes a positive potential (Vdd), and then, a corresponding one of the multi-beams 20 is deflected by an electric field due to a potential difference from the ground potential of the counter electrode 26 so as to be blocked by the limiting aperture substrate 206, thereby becoming in a beam OFF condition. On the other hand, in a state where an L electric potential is applied to the input (IN) of the CMOS inverter circuit, the output (OUT) of the CMOS inverter circuit becomes a ground potential, and therefore, since there is no potential difference from the ground potential of the counter electrode 26, a corresponding one of the multi-beams 20 is not deflected, thereby becoming in a beam ON condition by letting the beam concerned pass through the limiting aperture substrate 206.

The electron beam 20 passing through a corresponding passage hole is deflected by a voltage independently applied to the control electrode 24 and the counter electrode 26 being a pair. Blanking control is performed by this deflection. Specifically, a pair of the control electrode 24 and the counter electrode 26 individually provides blanking deflection of a corresponding beam of multi-beams by an electric potential switched by the CMOS inverter circuit which serves as a corresponding switching circuit. Thus, the blanking aperture array mechanism 204, using a plurality of electrodes, individually performs blanking deflection of a corresponding beam in the multi-beams having passed through a plurality of holes 22 (openings) of the shaping aperture array substrate 203.

Figure 5:
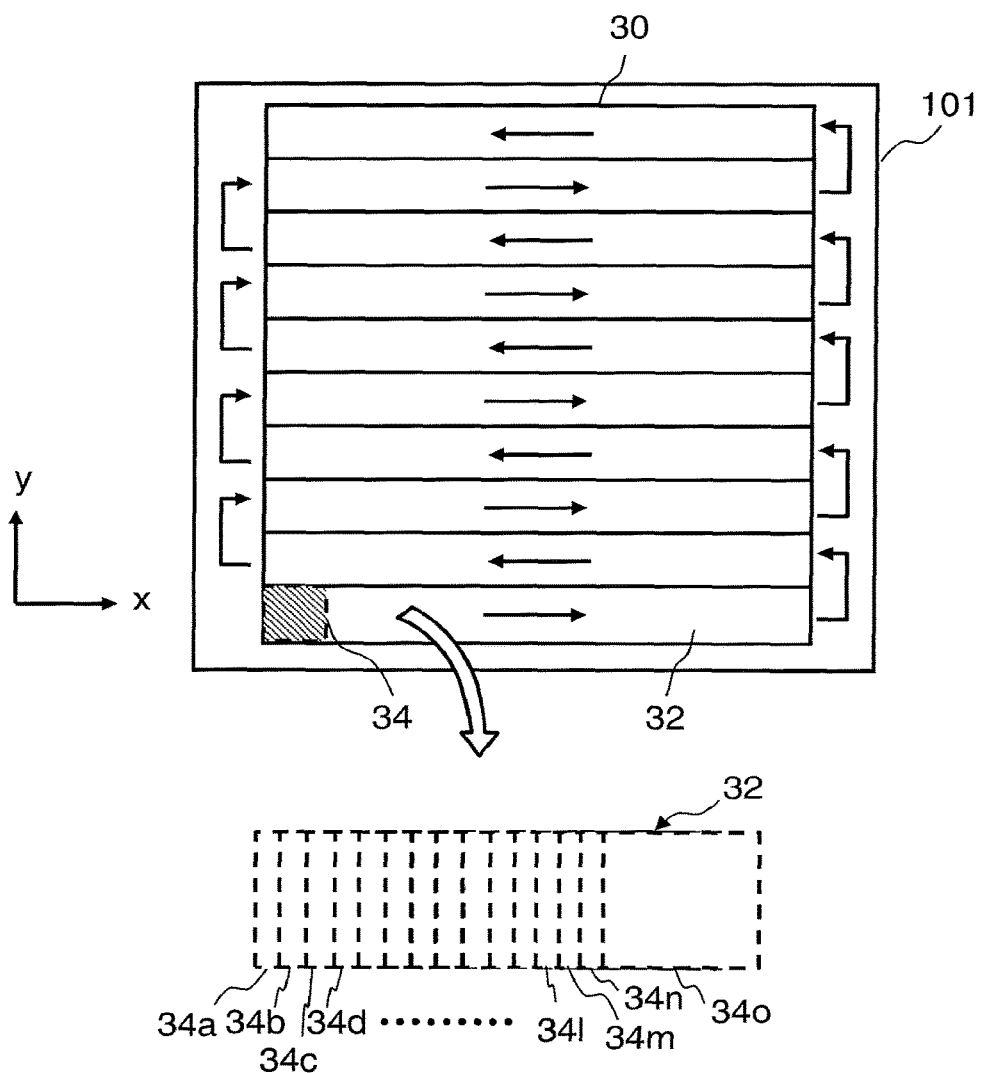
FIG. 5 is a conceptual diagram explaining an example of a writing operation according to the first embodiment.

FIG. 5 is a conceptual diagram explaining an example of a writing operation according to the first embodiment. As shown in FIG. 5, a writing region 30 of the target object 101 is virtually divided by a predetermined width in the y direction into a plurality of strip-shaped stripe regions 32, for example. First, the XY stage 105 is moved to make an adjustment such that an irradiation region 34 which can be irradiated with one shot of the multi-beams 20 is located at the left end of the first stripe region 32 or at a position more left than the left end, and then writing is started. When writing the first stripe region 32, the XY stage 105 is moved, for example, in the −x direction, so that the writing advances relatively in the x direction. The XY stage 105 is moved, for example, continuously at a constant speed. After writing the first stripe region 32, the stage position is moved in the −y direction to make an adjustment such that the irradiation region 34 is located at the right end of the second stripe region 32 or at a position more right than the right end and located relatively in the y direction. Then, by moving the XY stage 105 in the x direction, for example, writing similarly advances in the −x direction. That is, writing is performed while alternately changing the direction, such as performing writing in the x direction in the third stripe region 32, and in the −x direction in the fourth stripe region 32, thereby reducing the writing time. However, the writing operation is not limited to writing while alternately changing the direction, and it is also preferable to perform writing in the same direction when writing each stripe region 32. A plurality of shot patterns up to as many as the number of the holes 22 are formed at a time by one shot (total of irradiation steps to be described later) of multi-beams having been formed by passing through the holes 22 in the shaping aperture array substrate 203.

Figure 6:
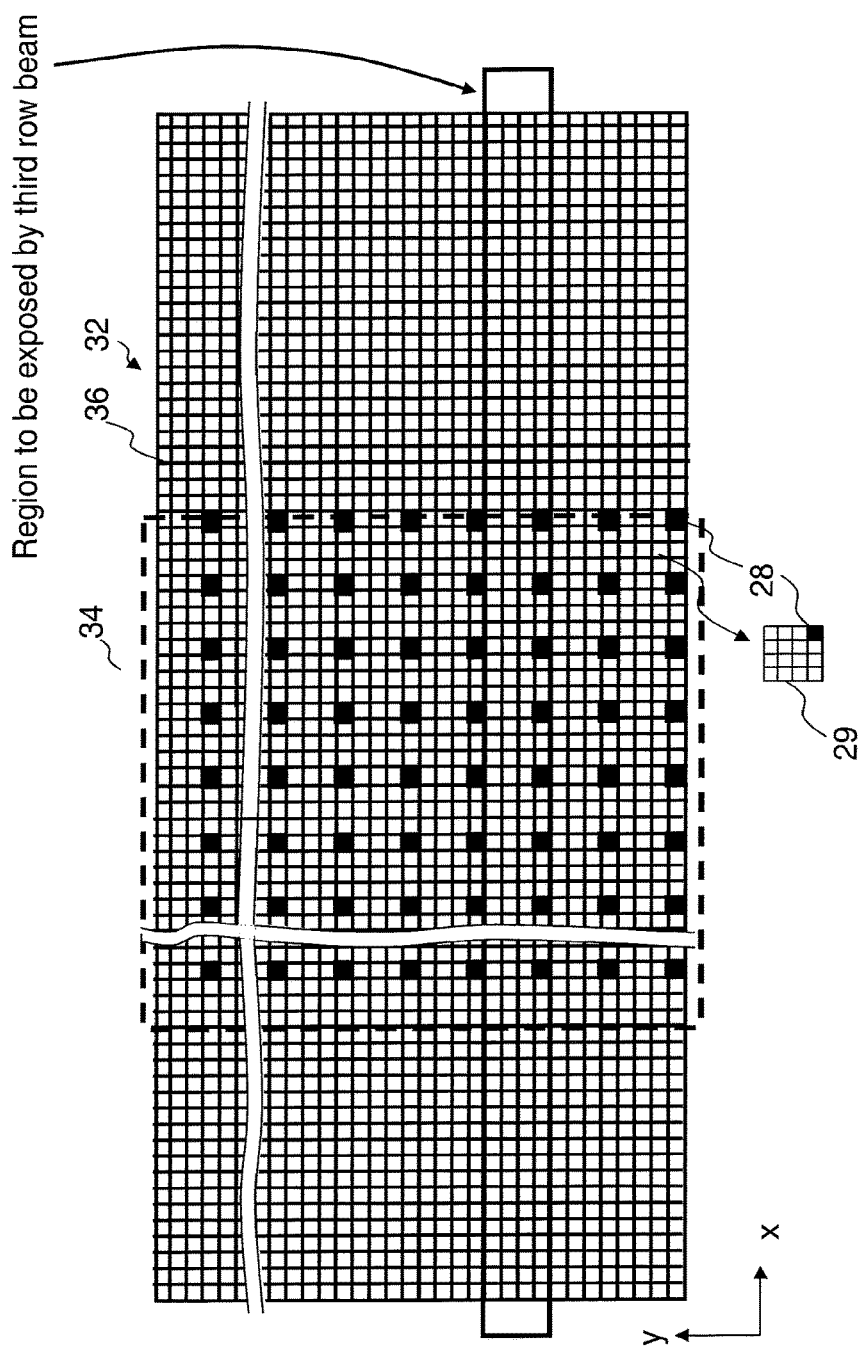
FIG. 6 shows an example of an irradiation region of multi-beams and a pixel to be written according to the first embodiment.

FIG. 6 shows an example of an irradiation region of multi-beams and a pixel to be written (writing pixel) according to the first embodiment. In FIG. 6, the stripe region 32 is divided into a plurality of mesh regions, for example, by the beam size of each of the multi-beams. Each mesh region serves as a writing pixel 36 (unit irradiation region or writing position). The size of the writing pixel 36 is not limited to the beam size, and may be an arbitrary size regardless of the beam size. For example, it may be 1/n (n being an integer of 1 or more) of the beam size. FIG. 6 shows the case where the writing region of the target object 101 is divided, for example, in the y direction, into a plurality of stripe regions 32 by the width size being substantially the same as the size of the irradiation region 34 (writing field) which can be irradiated with one irradiation of the multi-beams 20, for example. The width of the stripe region 32 is not limited to this. Preferably, the width of the stripe region 32 is n times (n being an integer of 1 or more) the size of the irradiation region 34. FIG. 6 shows the case of multi-beams of 8 (rows)×8 (columns). In the irradiation region 34, there are shown a plurality of pixels 28 (beam writing positions) which can be irradiated with one shot of the multi-beams 20. In other words, the pitch between the adjacent pixels 28 is the pitch between beams of the multi-beams. In the example of FIG. 6, one grid 29 is a square region surrounded by four adjacent pixels 28 at four corners and including one of the four pixels 28. In the example of FIG. 6, each grid 29 is composed of 4×4 pixels.

Figure 7:
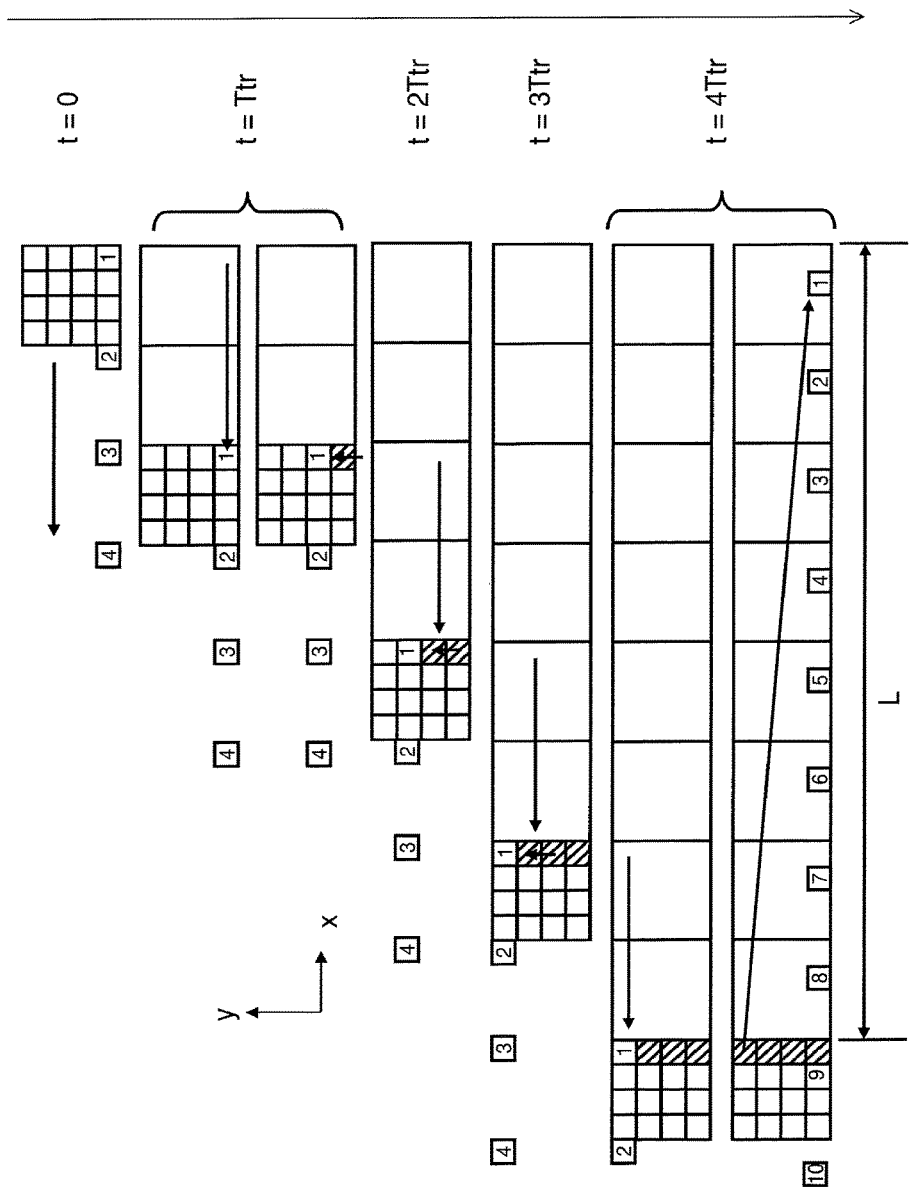
FIG. 7 illustrates an example of a writing method of multi-beams according to the first embodiment.

FIG. 7 illustrates an example of a writing method of multi-beams according to the first embodiment. FIG. 7 shows some grids to be written by respective beams at the coordinates (1, 3), (2, 3), (3, 3), . . . , (512, 3) in the third row from the bottom in the multi-beams for writing the stripe region 32 shown in FIG. 6. In the case of FIG. 7, while the XY stage 105 moves the distance of eight beam pitches, four pixels are written (exposed), for example. In order that the relative position between the irradiation region 34 and the target object 101 may not shift by the movement of the XY stage 105 while these four pixels are written (exposed), the irradiation region 34 is made to follow the movement of the XY stage 105 by collectively deflecting the entire multi-beams 20 by the deflector 208. In other words, tracking control is performed. In the example of FIG. 7, one tracking cycle is executed by writing (exposing) four pixels while moving the distance of eight beam pitches.

Specifically, the stage position measuring instrument 139 measures the position of the XY stage 105 by irradiating the mirror 210 with a laser and receiving a reflected light from the mirror 210. The measured position of the XY stage 105 is output to the control computer 110. In the control computer 110, the writing control unit 70 outputs the position information on the XY stage 105 to the deflection control circuit 130. The deflection control circuit 130 calculates deflection amount data (tracking deflection data) for deflecting beams to follow the movement of the XY stage 105. The tracking deflection data being a digital signal is converted to an analog signal by a DAC amplifier (not shown) and amplified to be applied as a tracking deflection voltage to the deflector 208.

The writing mechanism 150 irradiates each pixel 36 with a corresponding beam in an ON condition in the multi-beams 20 during a writing time (irradiation time or exposure time) corresponding to each pixel 36 within a maximum irradiation time Ttr of the irradiation time of each of the multi-beams of the shot concerned.

In the example of FIG. 7, the first pixel from the right in the bottom row of the grid 29 concerned is irradiated with the first shot of the beam (1) at coordinates (1, 3) during the time from t=0 to t=maximum irradiation time Ttr, for example. The XY stage 105 moves two beam pitches in the −x direction during the time from t=0 to t=Ttr, for example. During this time period, the tracking operation is continuously performed.

After the maximum irradiation time Ttr of the shot concerned has passed since the start of beam irradiation of the shot concerned, while the beam deflection for tracking control is continuously performed by the deflector 208, the writing position (previous writing position) of each beam is shifted to a next writing position (current writing position) of each beam by collectively deflecting the multi-beams 20 by the deflector 208, which is performed in addition to the beam deflection for tracking control. In the example of FIG. 7, when the time becomes t=Ttr, the pixel to be written (writing pixel) is shifted from the first pixel from the right in the bottom row of the grid 29 concerned to the first pixel from the right in the second row from the bottom. Since the XY stage 105 is moving at a fixed speed also during this time period, the tracking operation is continuously performed.

Then, while the tracking control is continued, respective corresponding beams in the ON condition in the multi-beams 20 are applied to shifted writing positions corresponding to the respective beams during a writing time corresponding to each of the respective beams within the maximum irradiation time Ttr of the shot concerned. In the example of FIG. 7, the first pixel from the right in the second row from the bottom of the grid 29 concerned is irradiated with the second shot of the beam (1) at coordinates (1, 3) during the time from t=Ttr to t=2Ttr, for example. The XY stage 105 moves two beam pitches in the −x direction during the time from t=Ttr to t=2Ttr, for example. During this time period, the tracking operation is continuously performed.

In the example of FIG. 7, when the time becomes t=2Ttr, the pixel to be written (writing pixel) is shifted from the first pixel from the right in the second row from the bottom of the grid 29 concerned to the first pixel from the right in the third row from the bottom by collectively deflecting the multi-beams by the deflector 208. Since the XY stage 105 is moving also during this time period, the tracking operation is continuously performed. The first pixel from the right in the third row from the bottom of the grid 29 concerned is irradiated with the third shot of the beam (1) at coordinates (1, 3) during the time from t=2Ttr to t=3Ttr, for example. The XY stage 105 moves two beam pitches in the −x direction during the time from t=2Ttr to t=3Ttr, for example. During this time period, the tracking operation is continuously performed. When the time becomes t=3Ttr, the pixel to be written (writing pixel) is shifted from the first pixel from the right in the third row from the bottom of the grid 29 concerned to the first pixel from the right in the fourth row from the bottom by collectively deflecting the multi-beams by the deflector 208. Since the XY stage 105 is moving also during this time period, the tracking operation is continuously performed. Then, the first pixel from the right in the fourth row from the bottom of the grid 29 concerned is irradiated with the fourth shot of the beam (1) at coordinates (1, 3) during the time from t=3Ttr to t=4Ttr, for example. The XY stage 105 moves two beam pitches in the −x direction during the time from t=3Ttr to t=4Ttr, for example. During this time period, the tracking operation is continuously performed. In this manner, writing of the pixels in the first column from the right of the grid 29 has been completed.

In the example of FIG. 7, after emitting a corresponding beam to the writing position of each beam which has been shifted three times from the initial position, the tracking position is returned to the start position of tracking where the tracking control was started, by resetting the beam deflection for tracking control. In other words, the tracking position is returned in the opposite direction to the direction of the stage movement. In the example of FIG. 7, when the time becomes t=4Ttr, tracking of the grid 29 concerned is cancelled, and the beam is swung back to a new target grid which has been shifted by eight beam pitches in the x direction. Although the beam (1) at the coordinates (1,3) has been described in the example of FIG. 7, writing is also similarly performed for each grid corresponding to a beam at other coordinates. That is, a beam at coordinates (n, m) completes writing of pixels in the first column from the right of a corresponding grid when the time becomes t=4Ttr. For example, a beam (2) at coordinates (2,3) completes writing of pixels in the first column from the right of a grid adjacent in the −x direction to the grid 29 concerned for the beam (1) of FIG. 7.

Since writing of the pixels in the first column from the right of each grid has been completed, in a next tracking cycle after resetting the tracking, the deflector 208 performs deflection such that the writing position of each corresponding beam is adjusted (shifted) to the second pixel from the right in the first row from the bottom of each grid.

As described above, each shot is performed while shifting the irradiation position (the position to be irradiated) pixel by pixel by the deflector 208 in a state such that the relative position of the irradiation region 34 to the target object 101 is controlled by the deflector 208 to be unchanged during the same tracking cycle. Then, after finishing one tracking cycle and returning the tracking position of the irradiation region 34, as shown in the lower part of FIG. 5, the shot position for the first shot is adjusted to the position shifted by one pixel, for example. Then, each shot is performed shifting the irradiation position pixel by pixel by the deflector 208 while performing a next tracking control. By repeating this operation during writing the stripe region 32, the position of the irradiation region 34 is shifted one by one, such as from 34a to 34o, to perform writing of the stripe region concerned.

Although, in the example described above, the deflector 208 performs both tracking deflection and shifting deflection, it is not limited thereto. It is also preferable that one of a plurality of deflectors, for example, two deflectors performs tracking deflection, and the other performs shifting deflection. Concrete operations of the writing mechanism 150 are described below.

The electron beam 200 emitted from the electron gun 201 (emission source) is refracted by the illumination lens 202 so as to illuminate the whole of the shaping aperture array substrate 203. A plurality of quadrangular holes 22 (first openings) are formed in the shaping aperture array substrate 203. The region including all the plurality of holes 22 is irradiated by the electron beam 200. For example, a plurality of quadrangular electron beams (multi-beams) 20a to 20e are formed by letting portions of the electron beam 200, which irradiates the positions of the plurality of holes 22, individually pass through a corresponding one of the plurality of holes 22 of the shaping aperture array substrate 203. Thus, the shaping aperture array substrate 203 forms the multi-beams 20, and also shapes the multi-beams 20. Each of the multi-beams 20a to 20e individually passes through a corresponding blanker (pair of the control electrode 24 and the counter electrode 26) (first deflector: individual blanking mechanism 47) of the blanking aperture array mechanism 204. The blanker provides blanking control such that at least an electron beam 20 individually passing through the blanker becomes in an ON condition during a writing time (irradiation time) having been set.

The multi-beams 20a to 20e having passed through the blanking aperture array mechanism 204 are refracted by the illumination lens 202, and go toward the hole in the center of the limiting aperture substrate 206. Then, the multi-beams 20a to 20e form a crossover (C.O.) at the height position of the center hole (third opening) of the limiting aperture substrate 206. At this stage, the electron beam 20 (beam 20a shown by dotted line in FIG. 1) which was deflected by the blanker of the blanking aperture array mechanism 204 deviates (shifts) from the hole in the center of the limiting aperture substrate 206 (blanking aperture substrate) and is blocked by the limiting aperture substrate 206. On the other hand, the electron beam 20 which was not deflected by the blanker of the blanking aperture array mechanism 204 passes through the hole in the center of the limiting aperture substrate 206 as shown in FIG. 1. Thus, the limiting aperture substrate 206 blocks each beam which was deflected to be in an OFF condition by the individual blanking mechanism 47. Then, the beam for one shot is formed by a beam which has been made during a period from becoming "beam ON" to becoming "beam OFF" and has passed through the limiting aperture substrate 206. The multi-beams 20 configure an aperture image (image of the aperture array by the multi-beams 20) of the holes 22 in the forming aperture array substrate 203. The multi-beams 20 composed of each beam having passed through the limiting aperture substrate 206 configure the aperture image of a desired reduction ratio of the holes 22 in the shaping aperture array substrate 203 by the objective lens group 212 individually excited by the lens control circuit 132, and are focused onto the target object 101. Then, beams (the whole of the multi-beams 20) having individually passed through the limiting aperture substrate 206 are collectively deflected in the same direction by the deflector 208 in order to irradiate respective beam irradiation positions on the target object 101. The multi-beams 20 irradiating at a time are ideally aligned at pitches obtained by multiplying the arrangement pitch of a plurality of holes 22 of the shaping aperture array substrate 203 by the desired reduction ratio.

In the writing apparatus 100, as shown in FIG. 1, the formed and shaped multi-beams 20 once converge by the illumination lens 202 and form a crossover (C.O.1). Then, the multi-beams 20 diffused after the crossover (C.O.1) converge again by the objective lens group 212 to form a crossover (C.O.2), and focus an image of a desired reduction ratio on the surface of the target object 101. In the first embodiment, the limiting aperture substrate 206 which limits passage of extra electrons is placed at the position of the crossover (C.O.1). When the multi-beams 20 are actually focused to form an image on the surface of the target object 101 by the objective lens group 212, the crossover (C.O.1) position of the multi-beams 20 may deviate from the design position, when in the on-focus state of the image of the multi-beams 20 on the target object 101 surface, due to the influence of manufacturing errors of the objective lens group 212, or the like. In such a case, if the position of the crossover (C.O.1) is adjusted to the design position by the illumination lens 202 on the upstream side, distortion of the image focused (formed) on the surface of the target object 101 becomes large. In particular, in multi-beam writing, since the size of the image formed on the target object 101 surface is markedly large compared with single beam writing, if distortion becomes large, the multi-beam writing will be greatly subject to the influence of the distortion compared to single beam writing.

On the other hand, if the crossover (C.O.1) position deviates from the design position, the beam size of the entire multi-beams 20 becomes large on the surface of the limiting aperture substrate 206 which is located at the design position. Therefore, if the size as it is, beam loss occurs because a part of the multi-beams 20 cannot pass through the opening in the limiting aperture substrate 206. In contrast, if the aperture diameter of the opening of the limiting aperture substrate 206 is widened, beam loss can be avoided, but extra electrons, the passage of which should originally be limited, also pass therethrough. Due to these extra electrons (leakage beam), the contrast of the image focused (formed) on the target object 101 surface decreases. Furthermore, in the case of performing blanking control by the limiting aperture substrate 206, if a blanking deflection amount by the individual blanking mechanism 47 is not increased, performing blanking control becomes difficult because a beam OFF condition cannot be achieved. Therefore, according to the first embodiment, the position of the limiting aperture substrate 206 is later actually, by the objective lens group 212, adjusted to the crossover (C.O.1) position in the on-focus state of the image of the multi-beams 20 on the target object 101 surface. It will be specifically described.

Figure 8:
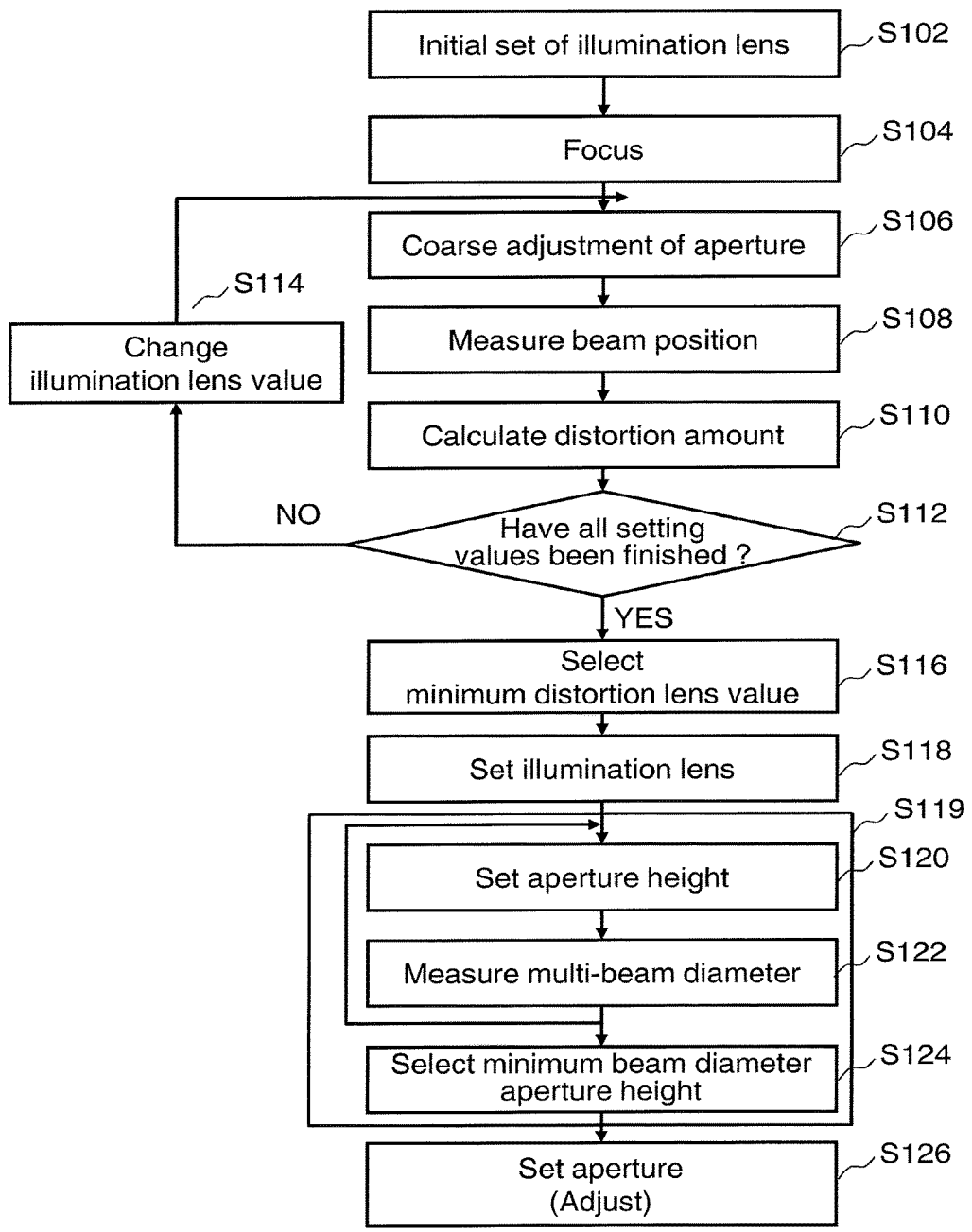
FIG. 8 is a flowchart showing main steps of an adjustment method for multi-beam optical system according to the first embodiment.

FIG. 8 is a flowchart showing main steps of an adjustment method for multi-beam optical system according to the first embodiment. In FIG. 8, the adjustment method for multi-beam optical system of the first embodiment executes a series of steps: an illumination lens initial setting step (S102), a focusing step (S104), an aperture coarse adjustment step (S106), a beam position measuring step (S108), a distortion amount calculation step (S110), a determination step (S112), an illumination lens value change step (S114), a minimum distortion lens value selection step (S116), an illumination lens setting step (S118), an aperture height setting step (S120), a multi-beam diameter measuring step (S122), a minimum beam diameter aperture height selecting step (S124), and an aperture setting (adjusting) step (S126). The aperture height setting step (S120), the multi-beam diameter measuring step (S122), and the minimum beam diameter aperture height selecting step (S124) configure a crossover position measuring step (S119).

In the illumination lens initial setting step (S102), the lens control circuit 131 sets a setting value of the illumination lens 202 for illuminating the shaping aperture array substrate 203 with the electron beam 200. First, an initial value is set which serves as a design lens value for exciting the illumination lens 202.

In the focusing step (S104), the lens control circuit 132 focuses the multi-beams 20 on the surface of the target object 101 by using the objective lenses 215 and 216 of two stages. According to the first embodiment, reduction and image formation of the multi-beams 20 are performed using the objective lenses 215 and 216 of two stages. In the first embodiment, a reduction optical system of high magnification is configured by using the multiple stage objective lenses 215 and 216. For example, the total reduction ratio is set to 200:1 to 300:1. The objective lens 215 is equivalent to an electromagnetic lens on the upstream side which reduces multi-beams. The objective lens 216 of the last stage is equivalent to an electromagnetic lens on the downstream side which reduces multi-beams.

Figure 9A:
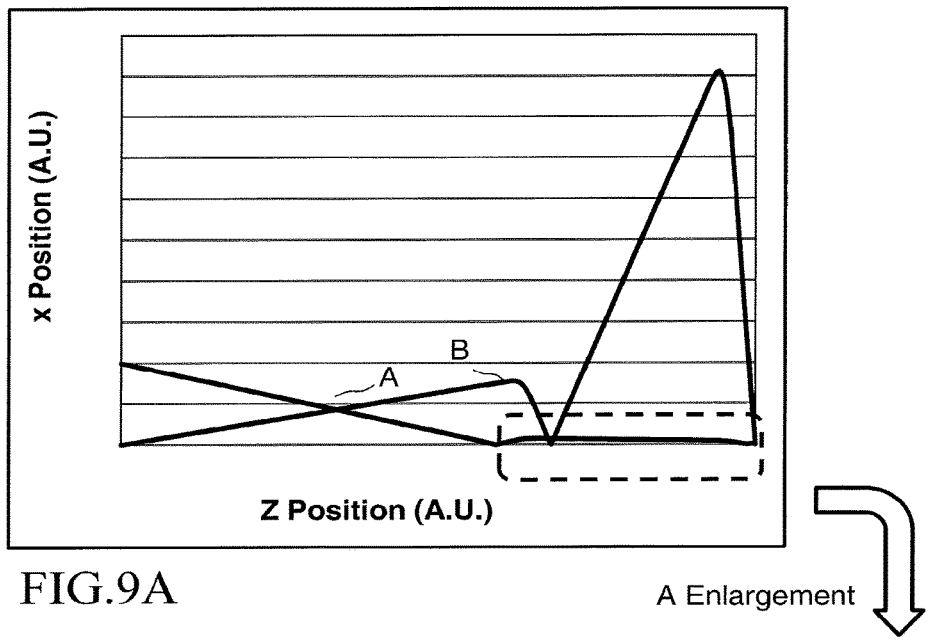
FIGS. 9A and 9B show an example of an outer diameter trajectory of multi-beams and an example of an aperture image forming trajectory of the center beam of multi-beams according to the first embodiment.
Figure 9B:
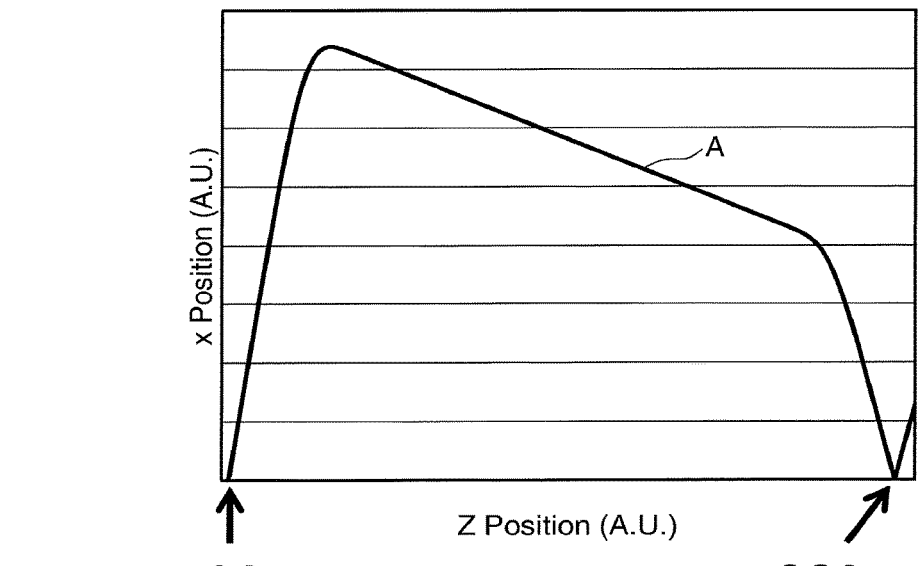

FIGS. 9A and 9B show an example of an outer diameter trajectory of multi-beams and an example of an aperture image forming trajectory of the center beam of multi-beams according to the first embodiment. In FIG. 9A, the ordinate axis represents a position (a. u) in the horizontal direction (e.g., x direction) from the optical axis of the image forming trajectory. The abscissa axis represents a position (a. u) in the height-wise direction (z direction) from the surface of the target object 101. The left end of the abscissa axis represents a height position of the backside of the shaping aperture array substrate 203, and the right end represents a height position of the upper surface of the target object 101. FIG. 9A shows an outer diameter trajectory (A) (off-axis trajectory) of the multi-beams 20, and an aperture image forming trajectory (B) (on-axis trajectory) of the center beam of the multi-beams. FIG. 9B shows an enlarged view of the outer diameter trajectory (A) (off-axis trajectory) of the multi-beams 20. As shown in FIG. 9A, the aperture image forming trajectory B (on-axis trajectory) of the center beam of multi-beams spreads from the backside (object surface) of the shaping aperture array substrate 203, and, after being focused by the objective lens 215, the spread trajectory is focused to form an image on the target object 101 surface by the objective lens 216. In that case, as shown in FIGS. 9A and 9B, the outer diameter trajectory A (off-axis trajectory) of the multi-beams 20 is refracted by the illumination lens 202 from the upstream side of the shaping aperture array substrate 203 toward the optical axis side so as to converge, and, after forming a crossover (C.O.1), refracted by the objective lenses 215 and 216 toward the optical axis side so as to converge to form a crossover (C.O.2), and to reach the target object 101 surface.

Figure 10:
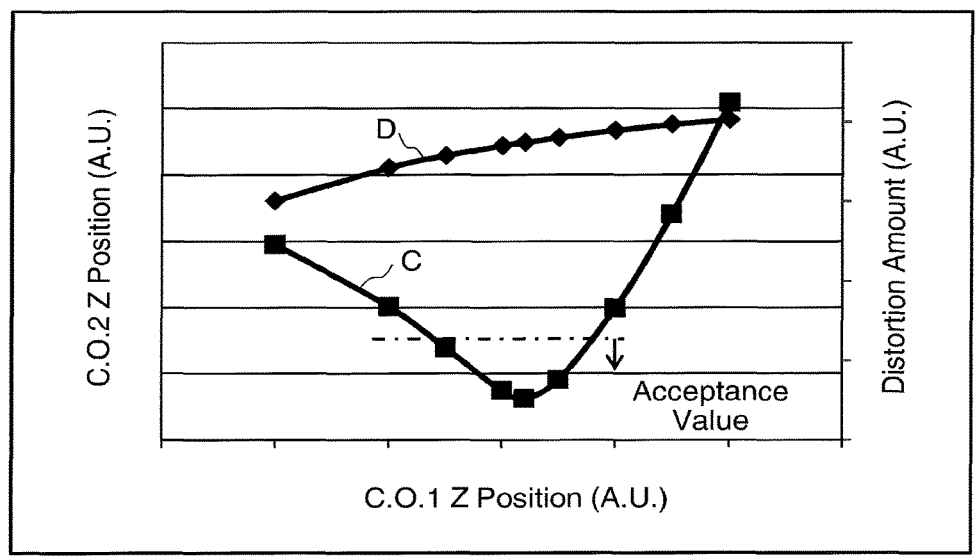
FIG. 10 shows an example of a relation between a crossover position and a distortion amount according to the first embodiment.

FIG. 10 shows an example of the relation between a crossover position and a distortion amount according to the first embodiment. In FIG. 10, the abscissa axis represents the height position of the crossover (C.O.1), the ordinate axis right side represents a distortion amount corresponding to the height position of the crossover (C.O.1), and the ordinate axis left side represents the height position of the crossover (C.O.2) corresponding to the height position of the crossover (C.O.1). With respect to the abscissa axis, as it goes rightward, it becomes closer to the target object surface. With respect to the ordinate axis left side, as it goes upward, it becomes closer to the target object surface. With respect to the ordinate axis right side, as it goes upward, the distortion amount becomes further increased. As shown in FIG. 10, the distortion amount (C) of an image of the multi-beams 20 formed on the target object surface is the minimum value at the optimum height position of the crossover (C.O.1), and the amount becomes increased before and after the optimum height position. Moreover, it turns out that the height position (D) of the crossover (C.O.2) becomes closer to the target object surface as the height position of the crossover (C.O.1) approaches the target object surface. For suppressing the distortion amount within an acceptable value, the range of the height position of the crossover (C.O.1) should also be restricted. Therefore, in the case where the design value of the crossover (C.O.1) height shifts from an acceptable range shown in FIG. 10, if the height position of the crossover (C.O.1) is adjusted to the design value, the distortion amount will shift from the acceptable range. Therefore, it turns out that it is preferable to adjust the height position of the limiting aperture substrate 206 to the height position of the crossover (C.O.1) instead of adjusting the height position of the crossover (C.O.1) to the design value.

In the aperture coarse adjustment step (S106), the aperture control circuit 136 drives the height position adjusting mechanism 214 in order to perform coarse adjustment of the height position of the limiting aperture substrate 206. Specifically, the coarse adjustment of the height position is performed such that all the beams of the multi-beams 20 pass through respective corresponding openings in the limiting aperture substrate 206. Whether all the beams of the multi-beams 20 pass through respective corresponding openings in the limiting aperture substrate 206 is determined as follows: The lens control circuit 132 excites the alignment coil 211 to deflect the multi-beams 20, and performs a scan on the limiting aperture substrate 206. Then, the detector 213 detects a secondary electron including a reflected electron which is emitted due to irradiation on the limiting aperture substrate 206 with the multi-beams 20. Data detected by the detector 213 is output to the amplifier 134 to be converted into digital data from analog data, and amplified so as to be output to the control computer 110. From the two-dimensional distribution of the obtained signal, an image of the multi-beam 20 measured by using the aperture opening as a hole mark is obtained. Resolution of this measurement with a hole mark is determined by the aperture opening size. In the control computer 110, the measurement unit 52 receives the detected data of the secondary electron and measures the image of the multi-beams 20. What is necessary here is to determine whether the size of the measured image of the multi-beams 20 is smaller than the size of the opening in the limiting aperture substrate 206. At the position of the limiting aperture substrate 206, the image of the multi-beams 20 is ideally one circle, but it may be an assembly of separated beam images. In the case of the separated beam images, it is sufficient to regard the size of a circle including the outermost periphery as the size of the image of the multi-beams 20. Then, the aperture control circuit 136 drives the height position adjusting mechanism 214 in order to perform coarse adjustment of the height position of the limiting aperture substrate 206 such that the size of the image of the multi-beams 20 becomes smaller than the size of the opening in the limiting aperture substrate 206. Alternatively, without using the alignment coil 211, the detector 213 may detect a secondary electron including a reflected electron which is emitted due to irradiation on the limiting aperture substrate 206 with the multi-beams 20. Then, the aperture control circuit 136 may drive the height position adjusting mechanism 214 in order to perform coarse adjustment of the height position of the limiting aperture substrate 206 such that no secondary electron is detected at the adjusted height position. The configuration of the height position adjusting mechanism 214 will be described later.

In the beam position measuring step (S108), the individual beam position detecting mechanism 218 measures the position of each of the multi-beams 20 in the state where all the beams of the multi-beams 20 pass through respective corresponding openings of the limiting aperture substrate 206.

Figure 11A:
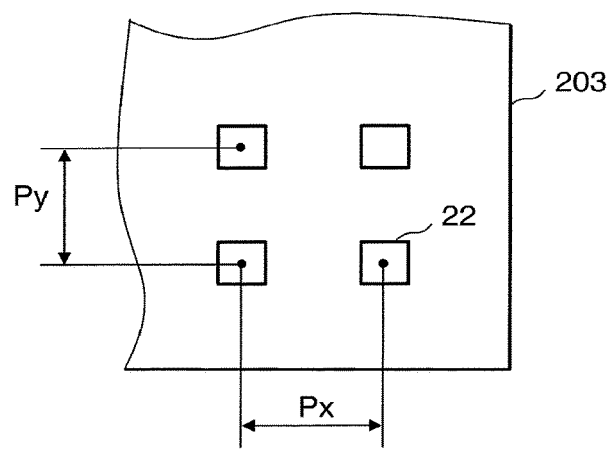
FIGS. 11A and 11B illustrate a method of detecting an individual beam position according to the first embodiment.
Figure 11B:
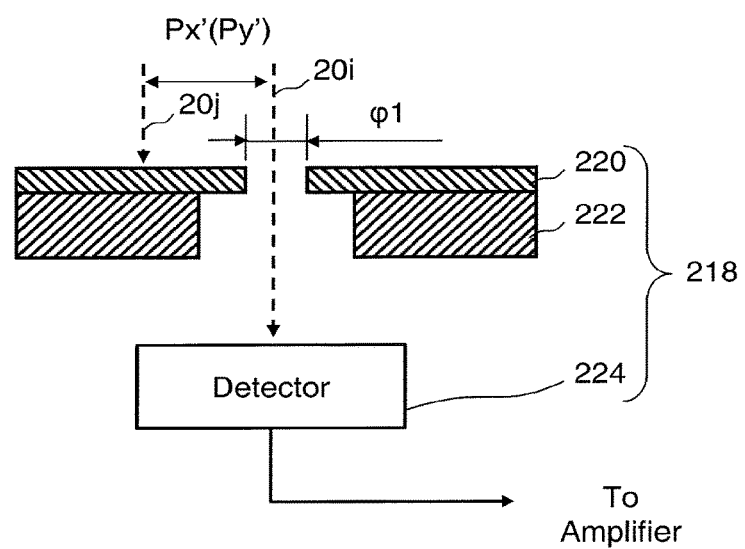

FIGS. 11A and 11B illustrate a method of detecting an individual beam position according to the first embodiment. As shown in FIG. 11A, a plurality of holes 22 for forming the multi-beams 20 are formed at a predetermined pitch (Px, Py) in the x and y directions in the shaping aperture array substrate 203. By being reduced at a desired reduction ratio by the objective lens group 212, beams are formed at a pitch (Px', Py') in the x and y directions on the target object 101. As shown in FIG. 11B, by making the size φ1 of the hole formed in the passage mark substrate 220 smaller than the pitch Px' (or Py') of each beam, it is possible to block and prevent passage of a beam 20j adjacent to a beam 20i being a measuring target, and to make a beam pass one by one. More preferably, the size φ1 of the hole is to be reduced by the blur size of the beam skirt portion. The height position of the upper surface of the passage mark substrate 220 is adjusted to be the same as that of the upper surface of the target object 101 by using the block 222. The region of the block 222 located on the underside of the hole formed in the passage mark substrate 220 is hollow, and the beam 20l being the measuring target and having passed through the hole in the passage mark substrate 220 enters the current detector 224. Then, the current detector 224 measures a current value of the incident beam 20i. Data detected by the current detector 224 is output to the amplifier 137 to be converted into digital data from analog data, and amplified so as to be output to the control computer 110. In the control computer 110, it is output to the measurement unit 53. The multi-beams 20 scan the passage mark substrate 220. The scanning of the multi-beams 20 can be performed by collectively deflecting the multi-beams 20 by the deflector 208. Thereby, the measurement unit 53 receives current value data detected based on the position of each beam. The intensity peak position of the current value data is detected as the position of the beam concerned.

In the distortion amount calculation step (S110), the distortion amount calculation unit 54 measures a distortion of the multi-beams 20 in the state where all the beams of the multi-beams 20 pass through respective corresponding openings formed in the limiting aperture substrate 206. Specifically, the distortion amount calculation unit 54 inputs each beam position, and calculates a distortion amount in the x and y directions based on the shape of the image formed at the input position of each beam. The calculated distortion amount is stored in the storage device 142. The individual beam position detecting mechanism 218 and the distortion amount calculation unit 54 are examples of a distortion measuring mechanism.

In the determination step (S112), the determination unit 56 determines whether all of a plurality of setting values (lens value) in a preset range for exciting the illumination lens 202 have been set or not. The range of the swing width (amplitude) of the setting value (lens value) may be preset as a width which is experientially determined to be required. For example, the swing width of the setting value (lens value) can be a predetermined width (range) centering on the design lens value for exciting the illumination lens 202. When all of a plurality of setting values (lens value) have not been set yet, it goes to the illumination lens value change step (S114). When all of a plurality of setting values (lens value) have already been set, it goes to the minimum distortion lens value selection step (S116).

In the illumination lens value change step (S114), the lens control circuit 131 sets a setting value of the illumination lens 202 for illuminating the shaping aperture array substrate 203 with the electron beam 200. Here, the setting value is changed to a value which has not been set yet in a plurality of setting values (lens value) in the preset range for exciting the illumination lens 202. Thereby, the height position of the crossover (C.O.1) of the multi-beams 20 is changed.

Then, it returns to the aperture coarse adjustment step (S106), and each step from the aperture coarse adjustment step (S106) to the illumination lens value change step (S114) is repeated until it is determined that all of a plurality of setting values (lens value) have been set in the determination step (S112).

As described above, the height position of the crossover (C.O.1) of the multi-beams 20 is variably adjusted based on the setting value of the illumination lens 202. Then, distortion of the multi-beams 20 is measured while varying the height position of the crossover (C.O.1) of the multi-beams 20.

In the minimum distortion lens value selection step (S116), the selection unit 58 selects (extracts) a setting value (lens value) of the illumination lens 202 which makes distortion of the multi-beams 20 smaller than others from obtained setting values of the illumination lens 202 corresponding to distortion amounts of the multi-beams 20.

In the illumination lens setting step (S118), the setting unit 60 outputs a control signal to the lens control circuit 131 so that the selected (extracted) setting value (lens value) may be set. The lens control circuit 131 sets the setting value (lens value) output from the setting unit 60, as a setting value of the illumination lens 202.

In the crossover height position measuring step (S119), the height position of the crossover (C.O.1) of the multi-beams 20 where distortion of the multi-beams 20 is smaller than others is measured. Specifically, it operates as follows:

In the aperture height setting step (S120), the setting unit 62 outputs the aperture height used at the time of coarse adjustment having been performed using the set lens value of the illumination lens 202 to the aperture control circuit 136. Then, the aperture control circuit 136 drives the height position adjusting mechanism 214 in order to set the height position of the limiting aperture substrate 206. First, by employing the aperture height used at the time of coarse adjustment having been performed using the lens value of the illumination lens 202 in the aperture coarse adjustment step (S106), the limiting aperture substrate 206 can be tentatively set at the height position where the whole of the multi-beams 20 passes through the opening of the limiting aperture substrate 206.

Figure 12:
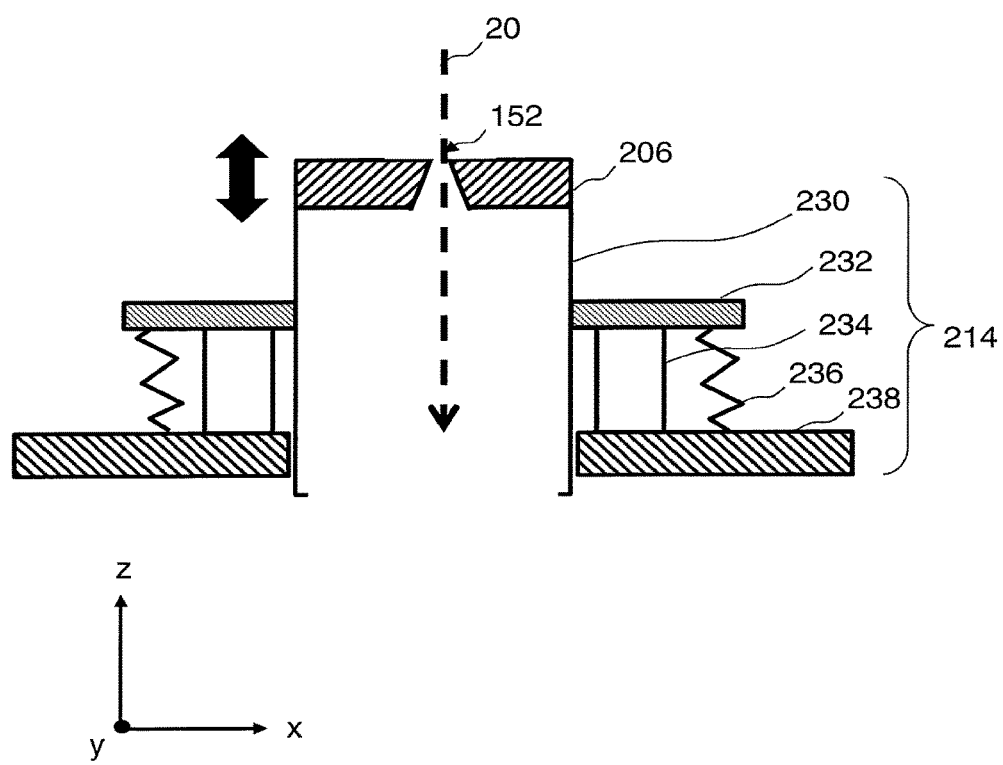
FIG. 12 shows an example of a structure of a height position adjusting mechanism according to the first embodiment.

FIG. 12 shows an example of the structure of a height position adjusting mechanism according to the first embodiment. In FIG. 12, the outer diameter end of the limiting aperture substrate 206 is supported by a drive cylinder 230 in the height position adjusting mechanism 214. The drive cylinder 230 is supported from the outside by a support plate 232. The support plate 232 is supported, across a piezoelectric element 234, on a support table 238 in which an opening of size through which the drive cylinder 230 can move in the optical axis direction is formed. The support plate 232 and the support table 238 are connected through a spring 236, and the size between the support plate 232 and the support table 238 is restricted to the size of the piezoelectric element 234 due to elastic force of the spring 236. The aperture control circuit 136 applies a control voltage to the piezoelectric element 234, drives the drive cylinder 230 depending on the elasticity of the piezoelectric element 234, and controls the height position of the limiting aperture substrate 206. In the example of FIG. 12, the height position adjusting mechanism 214 variably adjusts the height position of the limiting aperture substrate 206 by moving the limiting aperture substrate 206 up and down in the height direction. The multi-beams 20 pass through an aperture 152 opened in the central part of the limiting aperture substrate 206.

Moreover, the limiting aperture substrate 206 limits passage of a beam, in the multi-beams 20, which has been deviated from the trajectory.

In the multi-beam diameter measuring step (S122), the measurement unit 64 measures the beam diameter of the multi-beams 20. Specifically, the lens control circuit 132 excites the alignment coil 211, deflects the multi-beams 20, and scans the limiting aperture substrate 206. Then, the detector 213 detects a secondary electron including a reflected electron which is emitted due to irradiation on the limiting aperture substrate 206 with the multi-beams 20. Data detected by the detector 213 is output to the amplifier 134 to be converted into digital data from analog data, and amplified so as to be output to the control computer 110. In the control computer 110, the measurement unit 64 receives the detected data of the secondary electron and measures the beam size of the image of the multi-beams 20.

The aperture height setting step (S120) and the multi-beam diameter measuring step (S122) are repeated while changing the height position of the limiting aperture substrate 206 little by little. Then, the beam diameter of the multi-beams 20 at each height position is measured when changing the height position of the limiting aperture substrate 206 little by little. Information on measured beam diameters of the measured multi-beams 20 is stored in the storage device 142.

In the minimum beam diameter aperture height selecting step (S124), the selection unit 66 selects (extracts) the height position of the limiting aperture substrate 206 at which the beam diameter is minimum in the beam diameters of the multi-beams 20 at respective measured height positions. The height position of the limiting aperture substrate 206 at which the beam diameter is minimum serves as the height position of the crossover (C.O.1) of the multi-beams 20. As described above, the alignment coil 211, the detector 213, the amplifier 134, the measurement unit 64, the selection unit 66, etc. configure the measuring mechanism for measuring the height position of the crossover (C.O.1) of the multi-beams 20.

In the aperture setting (adjusting) step (S126), the setting unit 68 outputs the selected (extracted) height position of the limiting aperture substrate 206 to the aperture control circuit 136. Then, the aperture control circuit 136 drives the height position adjusting mechanism 214 in order to set the height position of the limiting aperture substrate 206 to the position at which the beam diameter is minimum. In other words, the height position adjusting mechanism 214 adjusts the height position of the limiting aperture substrate 206 that limits passage of a beam, in the multi-beams 20, which has been deviated from the trajectory to the crossover height position.

Figures 13A, 13B, 13C, 13D:
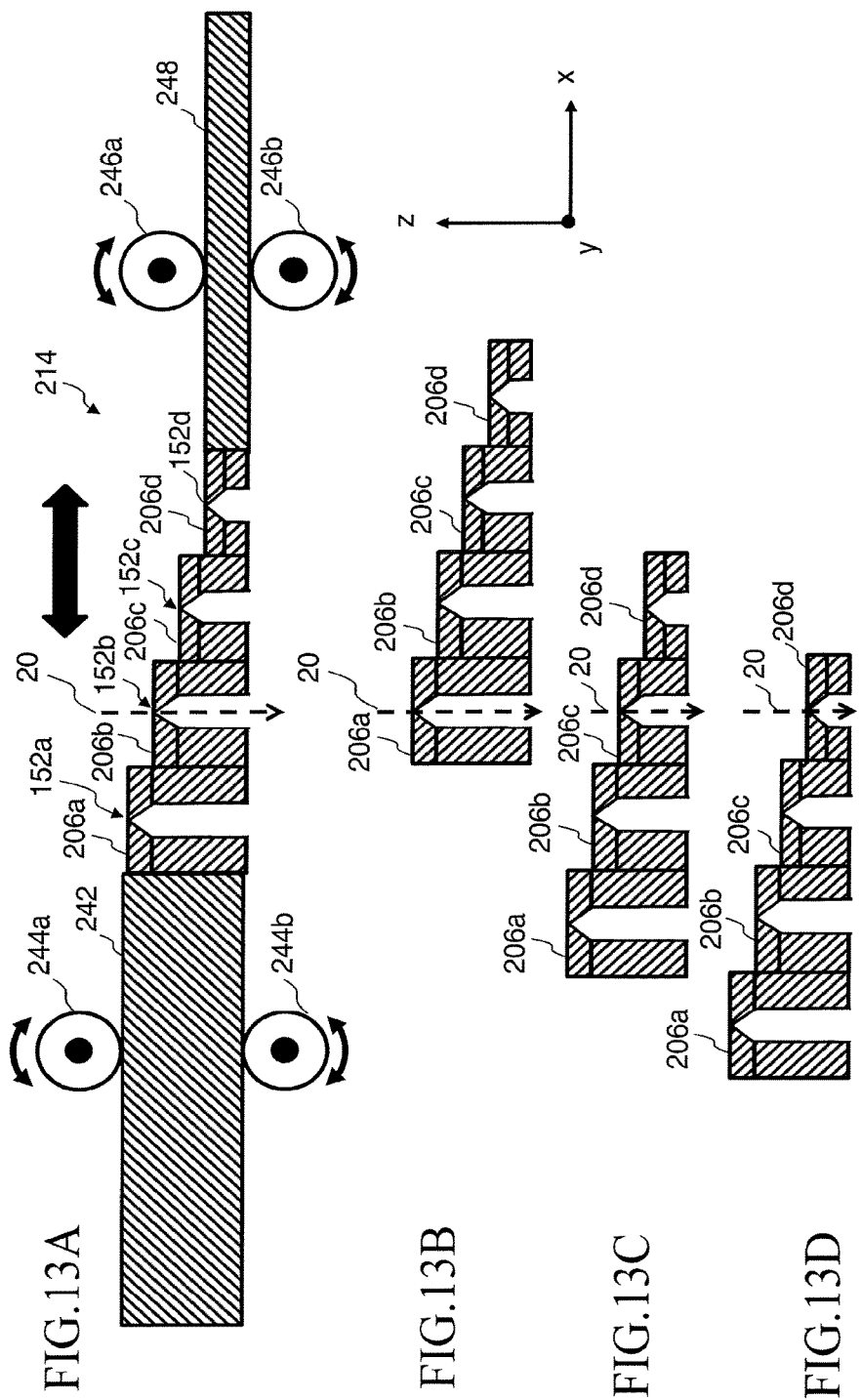
FIGS. 13A to 13D show other examples of the structure of the height position adjusting mechanism according to the first embodiment.

FIGS. 13A to 13D show other examples of the structure of the height position adjusting mechanism according to the first embodiment. As shown in FIG. 13A, the height position adjusting mechanism 214 includes drive plates 242 and 248, a pair of rollers 244a and 244b, and a pair of rollers 246a and 246b. The example of FIG. 13A shows a mechanism in which a plurality of limiting aperture substrates 206a, 206b, 206c, and 206d having different height positions are laterally connected. On both the sides of the connection of a plurality of limiting aperture substrates 206a, 206b, 206c, and 206d, there are connected the drive plates 242 and 248. The drive plate 242 is supported interposed between the pair of rollers 244a and 244b. The drive plate 248 is supported interposed between the pair of rollers 246a and 246b. The drive plates 242 and 248 can be moved in the x direction (or y direction) by rotating the pair of the rollers 244a and 244b and the pair of the rollers 246a and 246b such that the rollers of each pair rotate in opposite directions to each other. As shown in FIGS. 13A to 13D, since a plurality of limiting aperture substrates 206a, 206b, 206c, and 206d having different height positions are laterally connected, by moving the drive plates 242 and 248 in the x direction (or y direction), one of the limiting aperture substrates 206a, 206b, 206c, and 206d, having an arbitrary height, can be arranged on the optical axis along which the multi-beams 20 pass (travel). In other words, the height position adjusting mechanism 214 variably adjusts the height position of the limiting aperture substrate by sliding the limiting aperture substrate in the direction orthogonal to the optical axis of the multi-beams 20.

Figure 14:
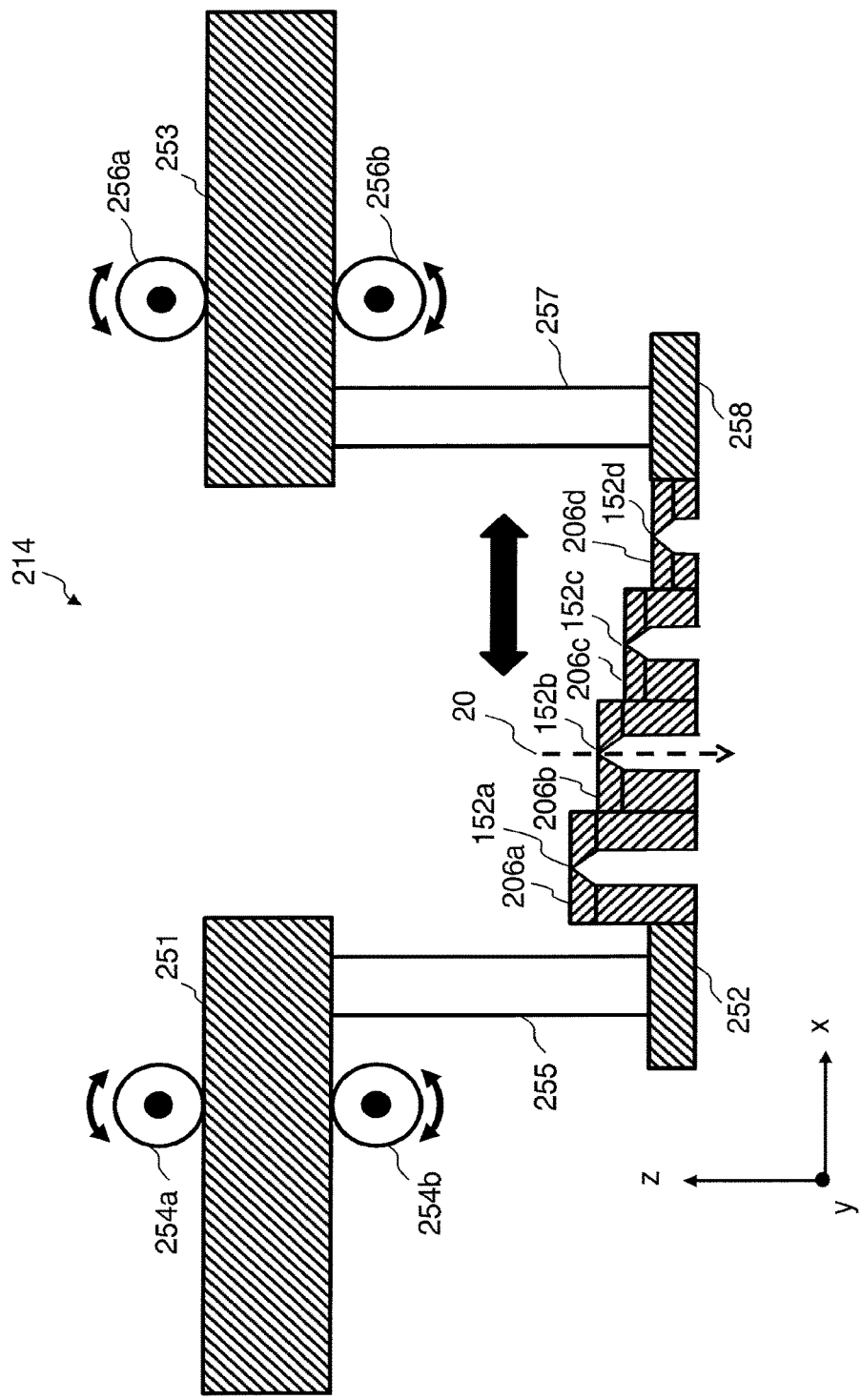
FIG. 14 shows another example of the structure of the height position adjusting mechanism according to the first embodiment.

FIG. 14 shows another example of the structure of the height position adjusting mechanism according to the first embodiment. The example of the height position adjusting mechanism 214 shown in FIG. 14 is a modification of the examples of FIGS. 13A to 13D. If the space in the x direction (or y direction) where a plurality of limiting aperture substrates 206a, 206b, 206c, and 206d are laterally connected is narrow, the arrangement height of the group of a drive plate 251 and a pair of rollers 254a and 254b, and the arrangement height of the group of a drive plate 253 and a pair of rollers 256a and 256b may be shifted from each other. FIG. 14 shows the case where the arrangement heights of the group of the drive plate 251 and the pair of the rollers 254a and 254b, and the group of the drive plate 253 and the pair of the rollers 256a and 256b are shifted upward from a plurality of limiting aperture substrates 206a, 206b, 206c, and 206d laterally connected. On both the sides of the connection of a plurality of limiting aperture substrates 206a, 206b, 206c, and 206d, there are connected auxiliary plates 252 and 258. A support rod 255 connects between the drive plate 251 and the auxiliary plate 252. A support rod 257 connects between the drive plate 253 and the auxiliary plate 258. The drive plate 251 is supported interposed between the pair of the rollers 254a and 254b. The drive plate 253 is supported interposed between the pair of rollers 256a and 256b. The drive plates 251 and 253 can be moved in the x direction (or y direction) by rotating the pair of the rollers 254a and 254b and the pair of the rollers 256a and 256b such that the rollers of each pair rotate in opposite directions to each other. As shown in FIG. 14A, since a plurality of limiting aperture substrates 206a, 206b, 206c, and 206d having different height positions are laterally connected, by moving the drive plates 251 and 253 in the x direction (or y direction), one of the limiting aperture substrates 206a, 206b, 206c, and 206d, having an arbitrary height, can be arranged on the optical axis along which the multi-beams 20 pass (travel).

Figure 15:
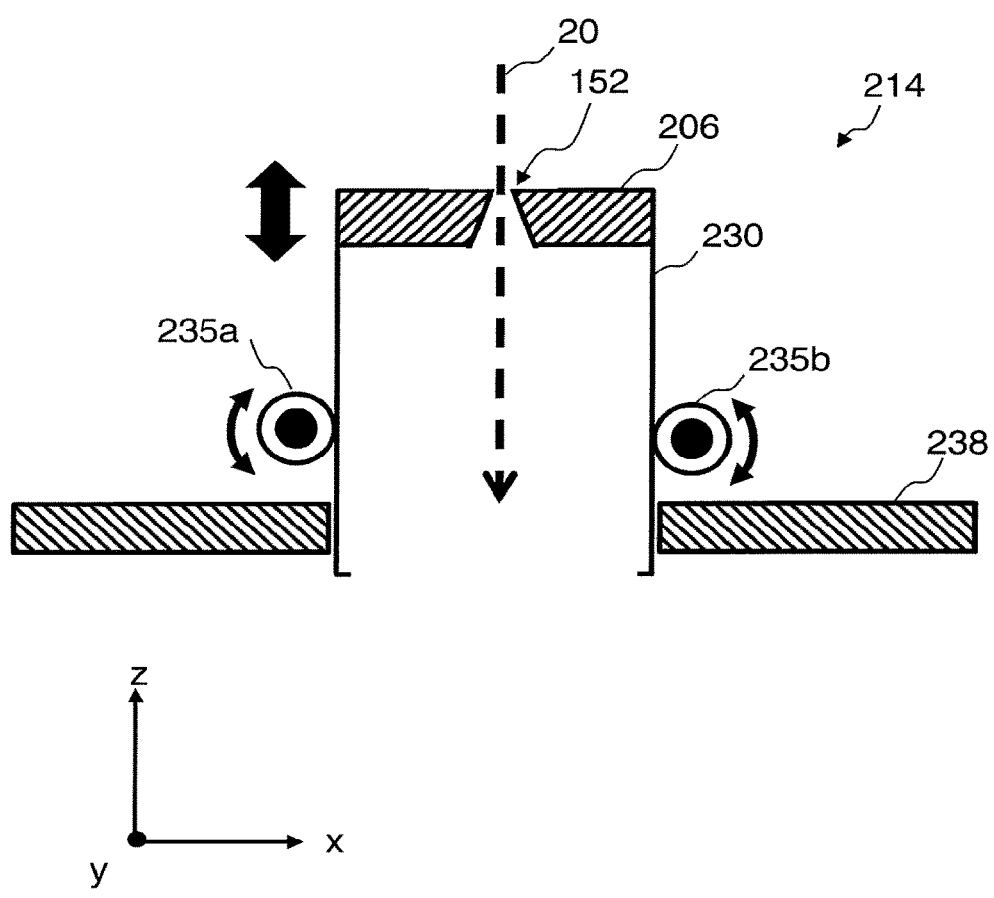
FIG. 15 shows another example of the structure of the height position adjusting mechanism according to the first embodiment.

FIG. 15 shows another example of the structure of the height position adjusting mechanism according to the first embodiment. The example of the height position adjusting mechanism 214 shown in FIG. 15 is a modification of the example of FIG. 12. In the case of FIG. 15, the drive cylinder 230 is interposed between a pair of rollers 235a and 235b instead of the support plate 232, the piezoelectric element 234, and the spring 236. Then, by rotating the rollers 235a and 235b in opposite directions to each other, the drive cylinder 230 is driven in the z direction (height-wise direction), and the height position of the limiting aperture substrate 206 is controlled to be an arbitrary height.

Although in the examples described above the height position of the limiting aperture substrate 206 is adjusted, it is not limited thereto.

Figure 16:
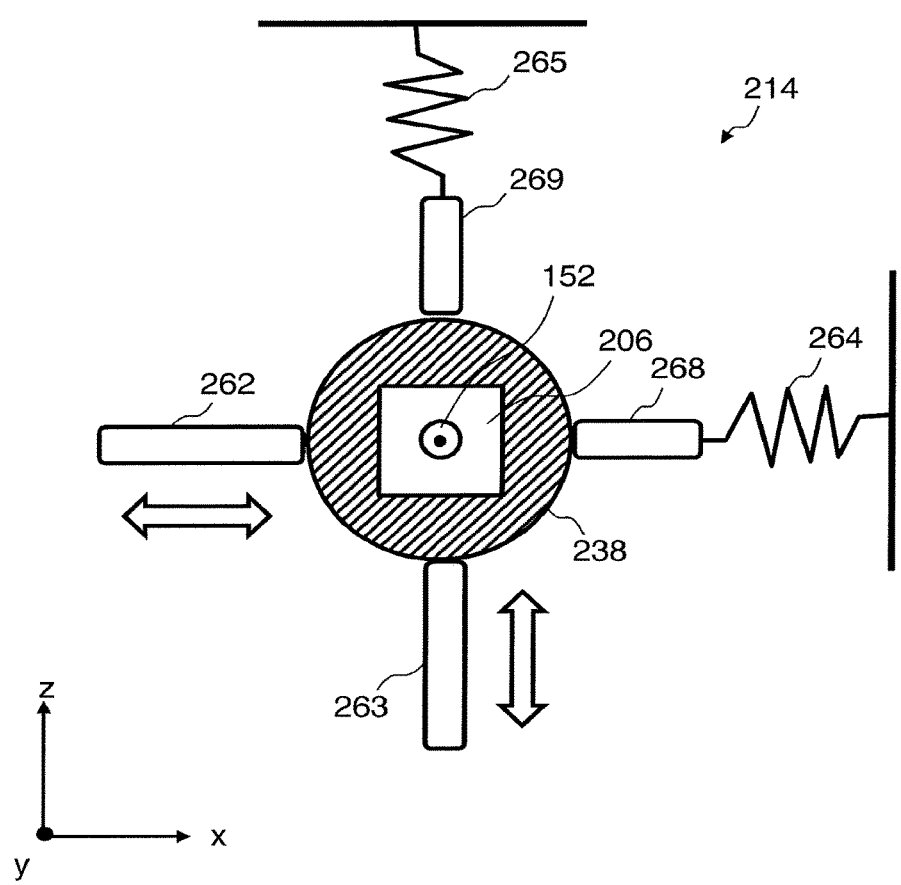
FIG. 16 shows another example of the structure of the height position adjusting mechanism according to the first embodiment.

FIG. 16 shows another example of the structure of the height position adjusting mechanism according to the first embodiment. In the example of the height position adjusting mechanism 214 shown in FIG. 16, a horizontal drive mechanism is further arranged in the structure of FIG. 12 or FIG. 15 described above. The height position adjusting mechanism 214 of FIG. 16 shows the case where the support table 238 is interposed between a piston 262 and an auxiliary rod 268 in the x direction. The auxiliary rod 268 is connected to a housing (e.g., inner wall of the electron optical column 102) with a spring 264. Similarly, the support table 238 is interposed between a piston 263 and an auxiliary rod 269 in the y direction. The auxiliary rod 269 is connected to the housing (e.g., inner wall of the electron optical column 102) with a spring 265. Then, by driving the piston 262 in the x direction by a stepping motor etc. (not shown) so as to push the support table 238 in the x direction, the x-direction position of the aperture 152 of the limiting aperture substrate 206 can be moved. Similarly, by driving the piston 262 in the −x direction so as to push the support table 238 in the −x direction by the spring 264, the −x direction position of the aperture 152 of the limiting aperture substrate 206 can be moved. Similarly, by driving the piston 263 in the y direction by a stepping motor, etc. (not shown) so as to push the support table 238 in the y direction, the y-direction position of the aperture 152 of the limiting aperture substrate 206 can be moved. Similarly, by driving the piston 263 in the −y direction so as to push the support table 238 in the −y direction by the spring 265, the −y direction position of the aperture 152 of the limiting aperture substrate 206 can be moved. Moreover, since the auxiliary rod 268 pushes the support table 238 in the −x direction by the elastic force of the spring 264, the movement in the x direction of the support table 238 is always restrained by the piston 262 and the auxiliary rod 268. Therefore, the x-direction position of the aperture 152 of the limiting aperture substrate 206 can be highly precisely controlled depending on the drive position of the piston 262. Similarly, since the auxiliary rod 269 pushes the support table 238 in the −y direction by the elastic force of the spring 265, the movement in the y direction of the support table 238 is always restrained by the piston 263 and the auxiliary rod 269. Therefore, the y-direction position of the aperture 152 of the limiting aperture substrate 206 can be highly precisely controlled depending on the drive position of the piston 263.

Figure 17:
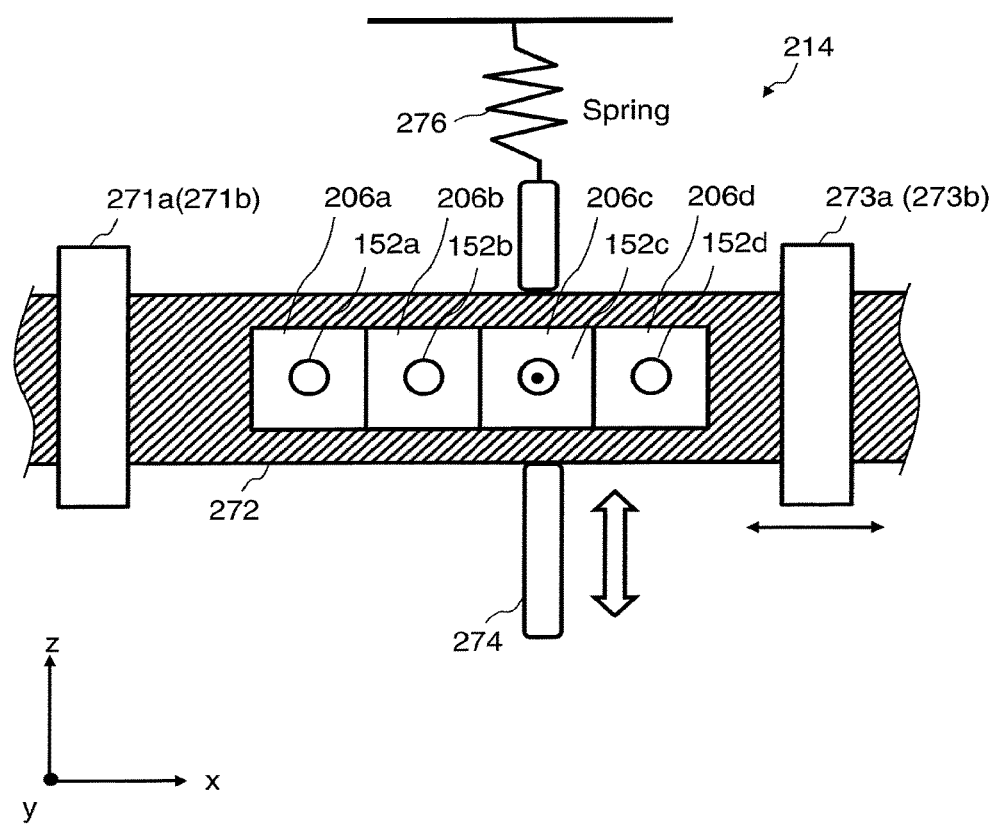
FIG. 17 shows another example of the structure of the height position adjusting mechanism according to the first embodiment.

FIG. 17 shows another example of the structure of the height position adjusting mechanism according to the first embodiment. The example of the height position adjusting mechanism 214 shown in FIG. 17 is a modification of the examples of FIGS. 13A to 13D described above. In the case of FIG. 17, a horizontal drive mechanism is further arranged. FIG. 17 shows the structure seen from the above. Similarly to the examples of FIGS. 13A to 13D, a plurality of limiting aperture substrates 206a, 206b, 206c, and 206d having different height positions and laterally connected are used. These plurality of limiting aperture substrates 206a, 206b, 206c, and 206d in the state connected laterally are arranged on a drive plate 272. Needless to say, through-holes are formed in the drive plate 272, to be located individually corresponding to the apertures 152a, 152b, 152c and 152d of a plurality of limiting aperture substrates 206a, 206b, 206c, and 206d, and to be individually wider than the apertures 152a, 152b, 152c, and 152d. The left end side of the drive plate 272 is supported interposed between a pair of rollers 271a and 271b. The right end side of the drive plate 272 is supported interposed between a pair of rollers 273a and 273b. The drive plate 272 can be moved in the x direction by rotating the pair of the rollers 271a and 271b and the pair of the rollers 273a and 273b such that the rollers of each pair rotate in opposite directions to each other. Since a plurality of limiting aperture substrates 206a, 206b, 206c, and 206d having different height positions are laterally (in the x direction) connected, one of the limiting aperture substrates 206a, 206b, 206c, and 206d, having an arbitrary height, can be arranged on the optical axis along which the multi-beams 20 pass (travel). Moreover, the drive plate 272 is interposed between a piston 274 and an auxiliary rod 277 in the y direction. The auxiliary rod 277 is connected to a housing (e.g., inner wall of the electron optical column 102) with a spring 276. Then, by driving the piston 274 in the y direction by a stepping motor etc. (not shown) so as to push the support plate 272 in the y direction, the y-direction position of the aperture 152 of the limiting aperture substrate 206 can be moved.

Figure 18:
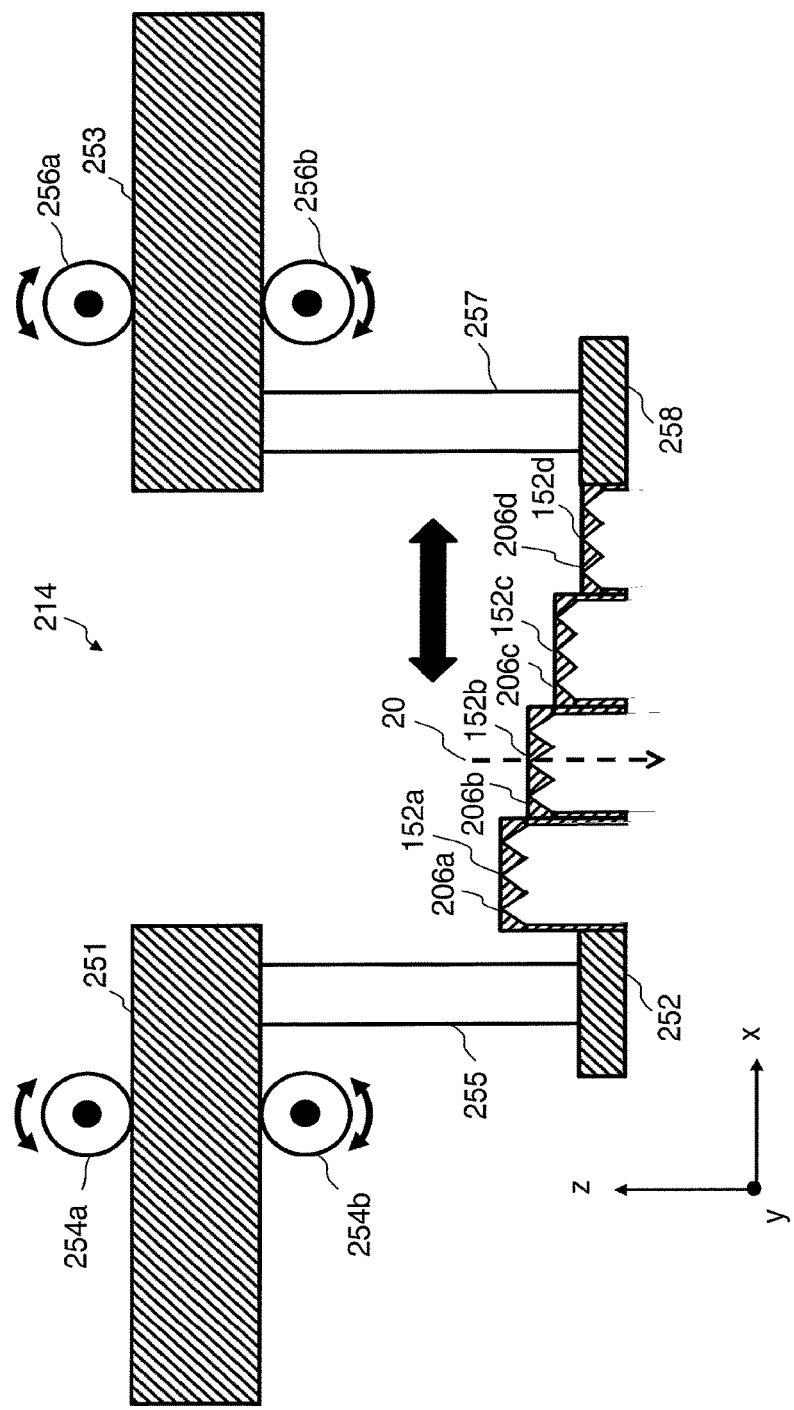
FIG. 18 shows another example of the structure of the height position adjusting mechanism according to the first embodiment.

FIG. 18 shows another example of the structure of the height position adjusting mechanism according to the first embodiment. The example of the height position adjusting mechanism 214 shown in FIG. 18 is a modification of the example of FIG. 14 described above. In the case of FIG. 18, a plurality of apertures 152 are formed in each of a plurality of limiting aperture substrates 206a, 206b, 206c, and 206d having different height positions. In the case of FIG. 18, three apertures 152a arranged in the x direction are formed in the limiting aperture substrate 206a. Similarly, three apertures 152b arranged in the x direction are formed in the limiting aperture substrate 206b. Similarly, three apertures 152c arranged in the x direction are formed in the limiting aperture substrate 206c. Similarly, three apertures 152d arranged in the x direction are formed in the limiting aperture substrate 206d. By forming a plurality of apertures 152 having the same height, even when one of the apertures 152 becomes clogged due to adhesion of contamination, etc., other apertures 152 having the same height can be used. Moreover, by preparing apertures having different aperture sizes, it becomes possible to select a suitable aperture even when crossover sizes are different. By preparing apertures of different dimensions at the same height, making adjustments using an aperture larger than a suitable aperture dimension, and then shifting the aperture substrate in parallel, it becomes possible to select a suitable aperture. By doing this, it is possible to facilitate the measurement when the beam size at the position of the aperture substrate is large at the initial adjustment. In addition, it is possible to select an aperture having the size most suitable for the condition even when the crossover dimension changes due to change in the illumination condition or the like by preparing the aperture with the size expected from the assumed operating conditions. The use of apertures of different sizes is not limited to the example of FIG. 18.

Figure 19:
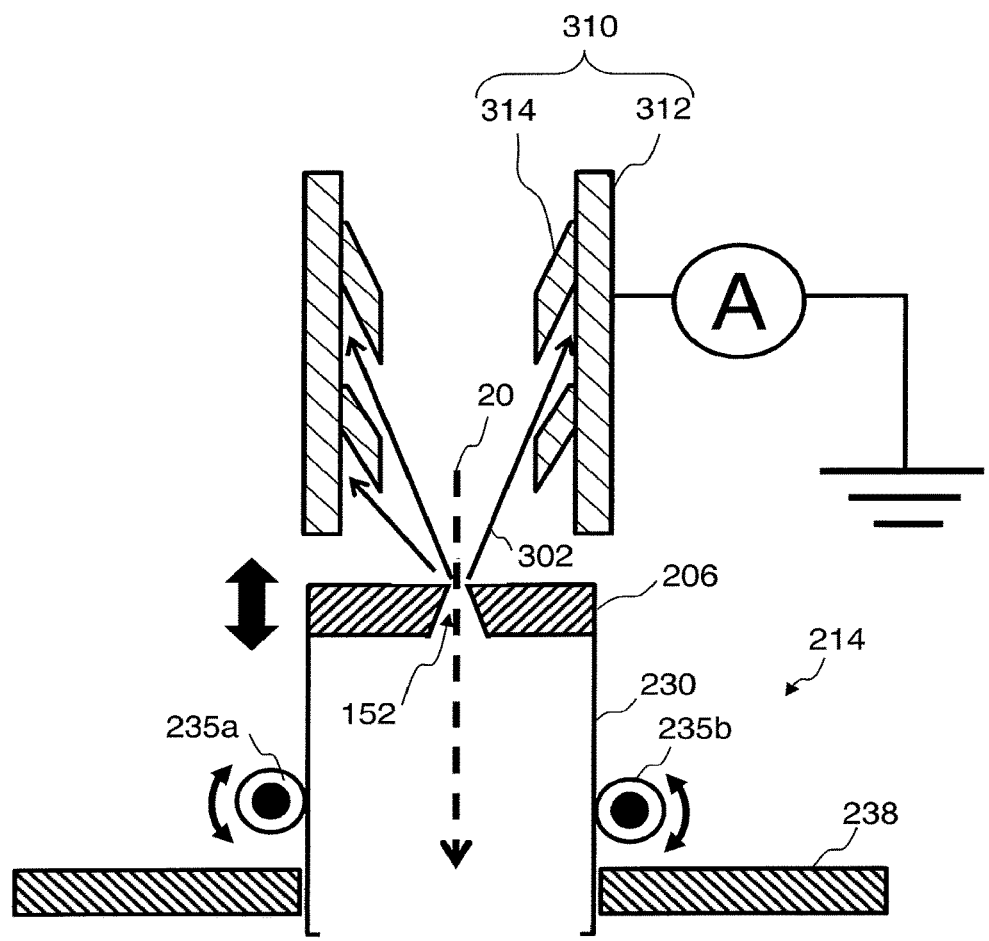
FIG. 19 shows an example of a structure of a height position adjusting mechanism in which a reflected electron absorption mechanism is arranged according to the first embodiment.

FIG. 19 shows an example of the structure of the height position adjusting mechanism according to the first embodiment in which a reflected electron absorption mechanism is arranged. FIG. 19 shows the case where a reflected electron absorption mechanism 310 is arranged above the height position adjusting mechanism 214 shown in FIG. 15. However, the structure is not limited to it. It is also preferable to arrange the reflected electron absorption mechanism 310 above other example of the height position adjusting mechanism 214 described above.

The reflected electron absorption mechanism 310 includes a tubular absorber 312 and a plurality of stator (or stationary) blades 314. The tubular absorber 312 is formed, for example, into a circular tubular (cylindrical) shape having a predetermined thickness. Moreover, the tubular absorber 312 includes a plurality of stator blades 314, which extend slightly upward to the center, on the inner wall side. FIG. 19 shows the case where two-stage stator blades 314 with shifted different heights are arranged, for example. The angle of each stator vane 218 is preferably adjusted toward the center of the aperture 152 formed in the limiting aperture substrate 206. By this angle adjustment, it becomes possible to efficiently take in a scattered electron and an x ray. Preferably, the stator blades 314 of respective stages may be formed in a truncated conical shape connected in a circumferential direction, or a plurality of stator vanes may be arranged side by side along the circumferential direction.

As the material of the tubular absorber 312 and a plurality of stator blades 314, atoms (low Z) whose atomic number is No. 13 (aluminum: Al) or less are used. It is also preferable to use, for example, carbon (C), etc. other than aluminum (Al). Moreover, a conductive material is used for the tubular absorber 312 and a plurality of stator blades 314 so that they may not be charged. In the case of colliding of scattered electrons, further generating a scattered electron and an x ray at a collision point can be reduced by using a low Z material. Even when a scattered electron colliding with the inner wall of the tubular absorber 312 is reflected, its trajectory is interfered with by the stator vane 314 located on the trajectory of reflection, and thus, the energy is consumed. Therefore, it is possible to make it difficult to return to the central region (transit region of the multi-beams 20) of the electron optical column 102. Thus, by collecting (trapping) scattered electrons, the reflected electron absorption mechanism 310 absorbs them. The reflected electron absorption mechanism 310 can prevent a reflected electron from reaching the blanking aperture array mechanism 204. It is also preferable to use the reflected electron absorption mechanism 310 as a reflected electron current detector.

As described above, according to the first embodiment, even when the height position of the crossover (C.O.1) deviates from the design position due to manufacturing errors of the optical system, etc., the limiting aperture substrate 206 can be variably adjusted to the height position of the crossover (C.O.1) of the multi-beams 20. Therefore, passage of an extra electron can be restricted while inhibiting distortion of formed images of multi-beams 20. Consequently, highly precise writing (exposing) can be achieved.

Embodiments have been explained referring to specific examples described above. However, the present invention is not limited to these specific examples.

While the apparatus configuration, control method, and the like not directly necessary for explaining the present invention are not described, some or all of them can be selectively used on a case-by-case basis when needed. For example, although description of the configuration of the control circuit for controlling the writing apparatus 100 is omitted, it should be understood that some or all of the configuration of the control circuit can be selected and used appropriately when necessary.

In addition, any other multi-beam optical system adjustment method and multi-beam exposure apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi-beam optical system adjustment method comprising:

forming multi-beams by making a region including a whole of a plurality of openings in a shaping aperture array substrate irradiated by a charged particle beam, and making portions of the charged particle beam individually pass through a corresponding one of the plurality of openings;

measuring a distortion of the multi-beams while variably changing a crossover height position of the multi-beams;

measuring the crossover height position of the multi-beams where the distortion of the multi-beams is smaller than others; and adjusting a height position of a limiting aperture substrate which limits passage of a beam deviated from a trajectory in the multi-beams to the crossover height position.

2. The method according to claim 1, further comprising:
setting a setting value of an illumination lens which illuminates the shaping aperture array substrate with the charged particle beam; wherein
the crossover height position is variably adjusted based on the setting value of the illumination lens.

3. The method according to claim 1, wherein the distortion of the multi-beams is measured in a state where all of the multi-beams pass through respective corresponding openings formed in the limiting aperture substrate.

4. The method according to claim 1, wherein the height position of the limiting aperture substrate is variably adjusted by sliding the limiting aperture substrate in a direction orthogonal to an optical axis of the multi-beams.

5. The method according to claim 1, wherein the height position of the limiting aperture substrate is variably adjusted by moving the limiting aperture substrate up and down in a height direction.

6. A multi-beam exposure apparatus comprising:
an emission source configured to emit a charged particle beam;
an illumination lens configured to illuminate a target with the charged particle beam;
a shaping aperture array substrate, in which a plurality of openings are formed, configured to form multi-beams by making a region including a whole of the plurality of openings irradiated with the charged particle beam emitted, and making portions of the charged particle beam individually pass through a corresponding one of the plurality of openings;
a limiting aperture substrate configured to limit passage of a beam deviated from a trajectory in the multi-beams;
a height position adjusting mechanism configured to variably adjust a height position of the limiting aperture substrate; and
a distortion measuring mechanism configured to measure a distortion of the multi-beams.

7. The apparatus according to claim 6, further comprising:
a measuring mechanism configured to measure a crossover height position of the multi-beams.

8. The apparatus according to claim 6, wherein the height position adjusting mechanism variably adjusts the height position of the limiting aperture substrate by moving the limiting aperture substrate up and down in a height direction.

9. The apparatus according to claim 6, wherein the height position adjusting mechanism variably adjusts the height position of the limiting aperture substrate by sliding the limiting aperture substrate in a direction orthogonal to an optical axis of the multi-beams.

* * * * *